United States Patent
Kim et al.

(10) Patent No.: US 8,143,781 B2
(45) Date of Patent: Mar. 27, 2012

(54) ORGANIC ELECTROLUMINESCENT COMPOUNDS WITH HIGH EFFICIENCY AND DISPLAY DEVICE USING THE SAME

(75) Inventors: Sung Min Kim, Seoul (KR); Bong Ok Kim, Seoul (KR); Mi Young Kwak, Seoul (KR); Hyuck Joo Kwon, Seoul (KR); Young Jun Cho, Seoul (KR); Hyun Kim, Seoul (KR)

(73) Assignee: Rohm and Haas Electronic Materials Korea Ltd., Seoul (KR)

( * ) Notice: Subject to any disclaimer, the term of this patent is extended or adjusted under 35 U.S.C. 154(b) by 0 days.

(21) Appl. No.: 12/743,194

(22) PCT Filed: Nov. 19, 2007

(86) PCT No.: PCT/KR2007/005804
§ 371 (c)(1),
(2), (4) Date: Nov. 16, 2010

(87) PCT Pub. No.: WO2009/066803
PCT Pub. Date: May 28, 2009

(65) Prior Publication Data
US 2011/0109223 A1     May 12, 2011

(51) Int. Cl.
*H01J 1/62* (2006.01)
*H01J 63/04* (2006.01)
*H01L 51/54* (2006.01)
*C07C 255/49* (2006.01)
*C07C 211/54* (2006.01)
*C07C 13/465* (2006.01)

(52) U.S. Cl. ........ 313/504; 313/506; 428/690; 428/917; 564/426; 570/183; 585/27

(58) Field of Classification Search .................. 313/504, 313/506; 428/428, 917; 558/420; 564/426; 570/183; 585/27
See application file for complete search history.

(56) References Cited

U.S. PATENT DOCUMENTS

2002/0122900 A1* 9/2002 Ueda et al. ............... 428/1.1
2005/0236977 A1* 10/2005 Yamada et al. ............ 313/504

* cited by examiner

*Primary Examiner* — Joseph L Williams
(74) *Attorney, Agent, or Firm* — Edwin Oh

(57) ABSTRACT

The present invention relates to an organic electroluminescent compound containing fluorenyl group and a display device using the same, more precisely the organic electroluminescent compound. The organic electroluminescent compound of the present invention is characterized by upgraded excellent EL property compared with the conventional host materials.

9 Claims, No Drawings

ORGANIC ELECTROLUMINESCENT COMPOUNDS WITH HIGH EFFICIENCY AND DISPLAY DEVICE USING THE SAME

TECHNICAL FIELD

The present invention relates to novel organic electroluminescent compounds, a preparing method thereof and a display device using the same.

BACKGROUND ART

The organic light-emitting diode (OLED) which is one of flat panel displays, is auto-luminescent, so that it has an excellent sight angle and contrast, compared with LCD, and it does not require a back light and can be prepared with simplified processes. As a result, a light thin display device can be produced with less electric energy power, and thus researches have been focused on it. The properties of OLED panel depend on the characteristics of an organic electroluminescent compound. Therefore, studies have been actively going on luminescent materials.

Luminescent materials are divided largely into two groups according to their functions; host materials and dopant materials. To produce a display device with the structure appropriate for upgraded EL property, a host material is doped with a dopant material to generate a luminescent layer. It is an urgent request to develop an organic EL display device with high efficiency and long lifetime, in particular it is strongly requested to develop an excellent host material with improved properties compared with the conventional light-emitting materials, considering EL needed for medium/large sized OLED panels. So, one of the most important tasks is definitely to develop an excellent host material.

It is preferable for a host material which acts as an energy and/or a solid solvent carrier to have high purity and a required molecular weight for vacuum deposition. In addition, it is also required for a host material to have high glass transition temperature and pyrolysis temperature to secure thermo-stability, and at the same time to have high electrochemical stability for long lifetime. In order to generate an amorphous thin layer, a host material has to have a good adhesive power with other layers and materials nearby but has to avoid migration through layers.

Many of host materials have been reported so far and the most representative host materials are exemplified by diphenylvinyl-biphenyl (DPVBi) by Idemitsu-Kosan Co. Ltd. and dinaphthyl-anthracene (DNA) by Kodak Co. However, these materials still need to be improved in their efficiency, lifetime, and color purity, etc.

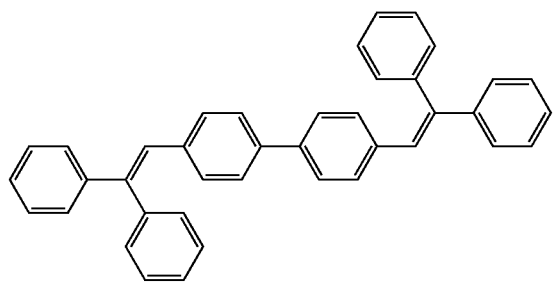

DPVBi

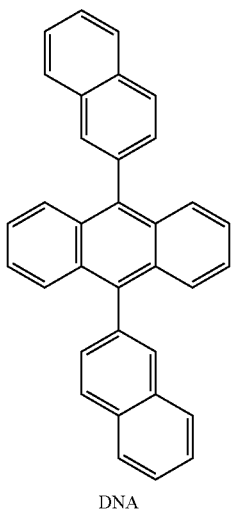

DNA

As an attempt to develop a host material with high efficiency and long lifetime, di-pyrenylfluorene (DPF) and bis-phenylanthracene-spirofluorene (BPA-SP) having the following structure have been introduced, but they cannot meet our expectation for luminous efficiency, lifetime and color purity.

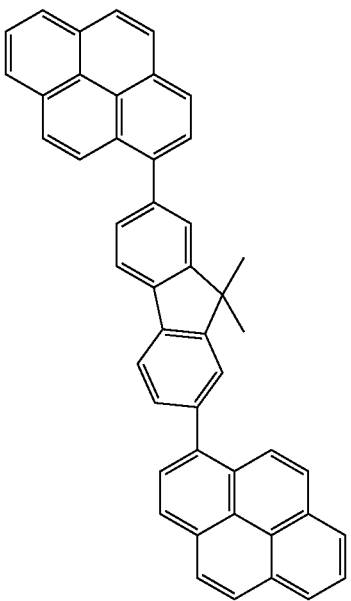

DPF

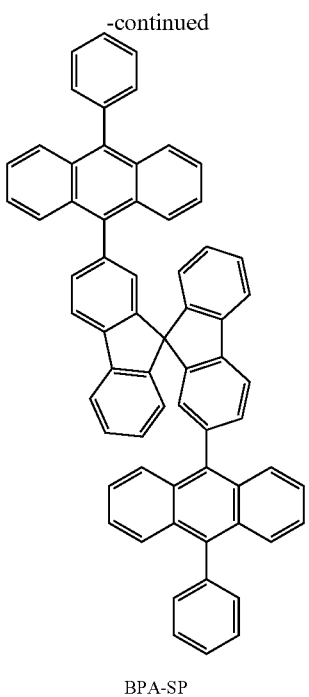

BPA-SP

For example, in the case of DPF presented by Cannon Inc. (Saitoh, A. et. al. Digest of tech. papers-SID 2004, 35, 686; US Patent No. US 2005236977), it exhibits excellent EL property (0.15, 0.14) and external quantum efficiency of 3.9% under the optimum doping condition, which is still not satisfactory for commercialization though. In the meantime, BPA-SP (Shen, W.-J. et. al. Chemistry of Materials, 2004, 16, 930; US Patent No. US 2002122900) exhibits the luminous efficiency of 2.67 cd/A and comparatively excellent color coordinate (0.15, 0.11), which is still not satisfactory for commercialization, either.

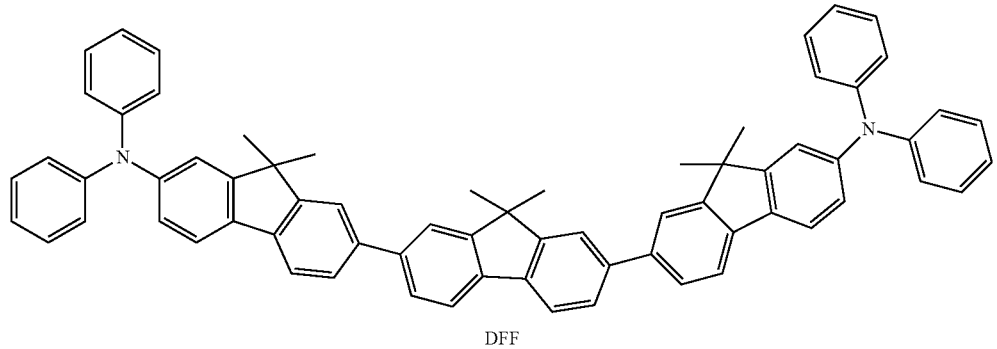

DFF

DISCLOSURE

Technical Problem

It is an object of the present invention to provide an organic electroluminescent compound having excellent structure providing improved luminous efficiency and color coordinate, compared with the conventional host materials, and to provide a display device containing the same.

Technical Solution

Hereinafter, the present invention is described in detail.

The present invention relates to the organic electroluminescent compound represented by the following formula 1 and the organic light emitting diode (OLED) hiring the said compound as a luminescent material. The organic electroluminescent compound of the present invention also is used as other layers as well as luminescent layer.

[Formula 1]

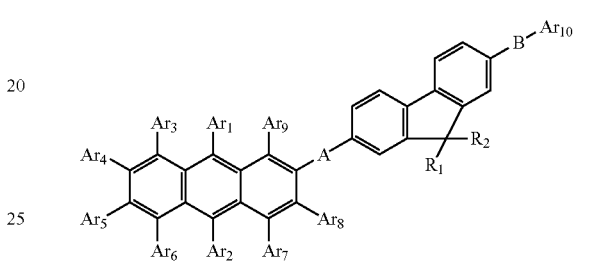

Wherein, A and B are independently chemical bonds or $C_6$-$C_{30}$ arylene $Ar_1$ and $Ar_2$ are independently $C_6$-$C_{30}$ aryls $Ar_3$-$Ar_9$ are independently H, $C_1$-$C_{20}$ straight or branched alkyl or alkoxy, $C_6$-$C_{30}$aryl or heteroaryl, or halogen $R_1$ and $R_2$ are independently H, $C_1$-$C_{20}$ straight or branched alkyl, or $C_6$-$C_{30}$aryl, and $R_1$ and $R_2$ can form a spiro-ring by alkylene or fusion ring alkylene $Ar_{10}$ is H, $C_1$-$C_{20}$ straight or branched alkyl, $C_6$-$C_{30}$ aryl or halogen and the said arylene, aryl, heteroaryl, alkyl, and alkoxy can be substituted with $C_1$-$C_{20}$ straight or branched alkyl, diarylamino or halogen.

In the organic electroluminescent compound of the present invention, $Ar_{10}$ is particularly phenyl, naphthyl, anthryl or fluorenyl, and the $Ar_{10}$ can be substituted with one or more compounds selected from the group consisting of $C_1$-$C_{20}$ straight or branched alkyl, phenyl, naphthyl, fluorenyl, diarylamino and halogen.

The organic electroluminescent compound of the present invention also includes the compound represented by the following formula 2 in which $Ar_{10}$ contains anthryl.

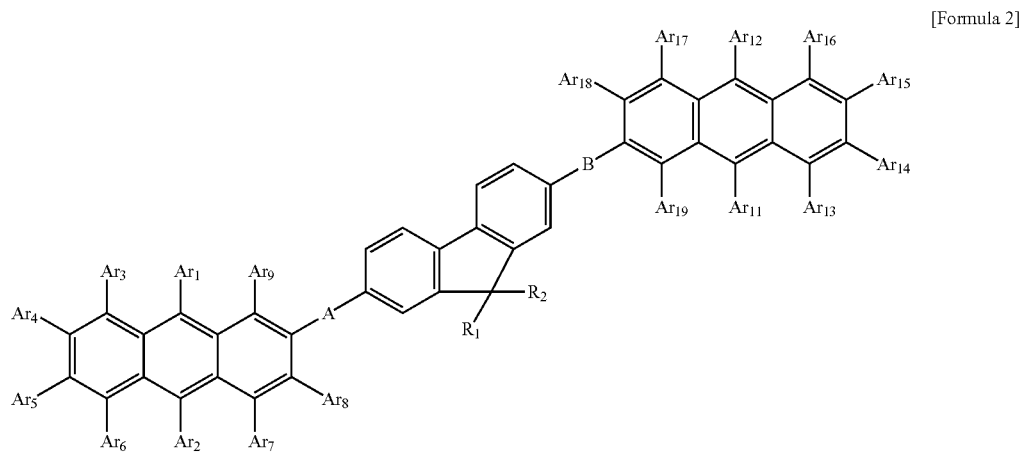

[Formula 2]

Wherein, $Ar_1$-$Ar_2$ are the same as defined in formula 1; $Ar_{11}$ and $Ar_{12}$ are independently $C_6$-$C_{30}$ aryl $Ar_{13}$-$Ar_{19}$ are independently H, $C_1$-$C_{20}$ straight or branched alkyl or alkoxy, $C_6$-$C_{30}$ aryl or heteroaryl, or halogen and the aryl, heteroaryl and alkyl can be substituted with $C_1$-$C_{20}$ straight or branched alkyl, aryl, diarylamino or halogen.

and $Ar_{12}$ are independently phenyl, tolyl, biphenyl, benzyl, naphthyl, anthryl and fluorenyl.

The organic electroluminescent compound of the present invention contains compounds represented by formula 3 and formula 4.

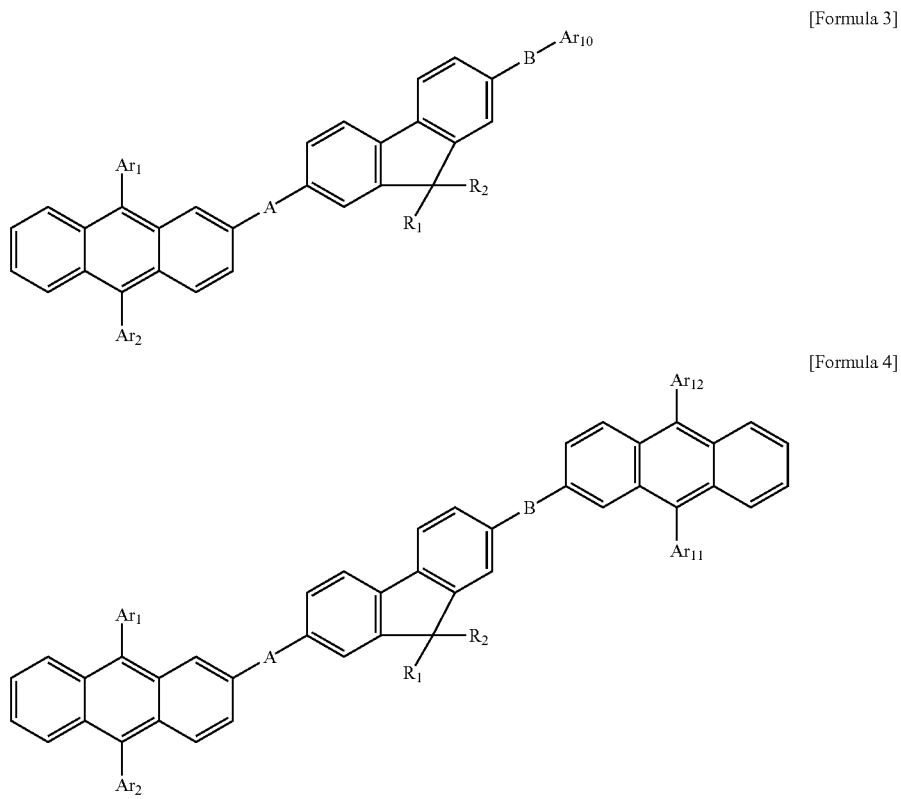

[Formula 3]

[Formula 4]

In the above formula 1 and formula 2, $R_1$ and $R_2$ are respectively selected from the group consisting of hydrogen, methyl, ethyl, propyl, isopropyl, butyl, isobutyl, pentyl, hexyl, ethylhexyl, heptyl, octyl, isooctyl, nonyl, decyl, dodecyl, hexadecyl, cyclopentyl, cyclohexyl, phenyl, tolyl, biphenyl, benzyl, naphthyl, anthryl and fluorenyl. $Ar_1$, $Ar_2$, $Ar_{11}$ In formula 3 and formula 4, A and B are independently chemical bonds or 1,4-phenylene, 1,3-phenylene, 1,4-naphthalene, 1,5-naphthalene or 2,6-naphthalene; $Ar_1$, $Ar_2$, $Ar_{11}$ and $Ar_{12}$ are independently selected from the group consisting of phenyl, 4-tolyl, 3-tolyl, 2-tolyl, 2-biphenyl, 3-biphenyl, 4-biphenyl, (3,5-diphenyl)phenyl, 9,9-dimethyl-fluorene-2- yl, 9,9-diphenyl-fluorene-2-yl, (9,9-(4-methylphenyl)-fluorene-2-yl, 1-naphthyl, 2-naphthyl, 1-anthryl, 2-anthryl, 3-anthryl and 2-spirofluorenyl.
The organic electroluminescent compound of the present invention can be represented by the following formulas, but these formulas cannot limit the scope of the present invention.
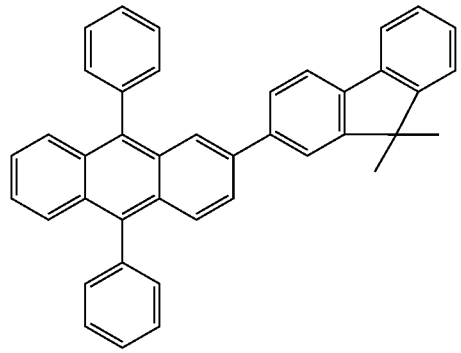
101
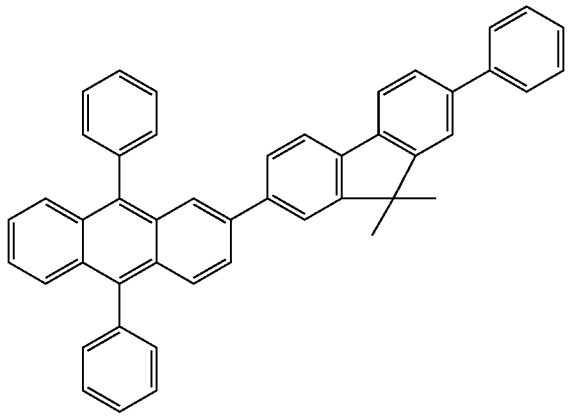
102
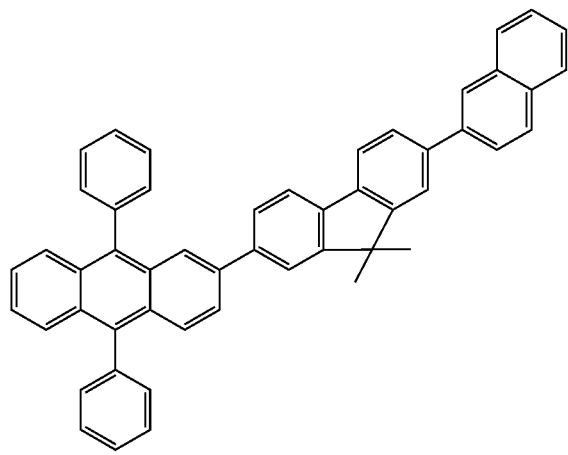
103
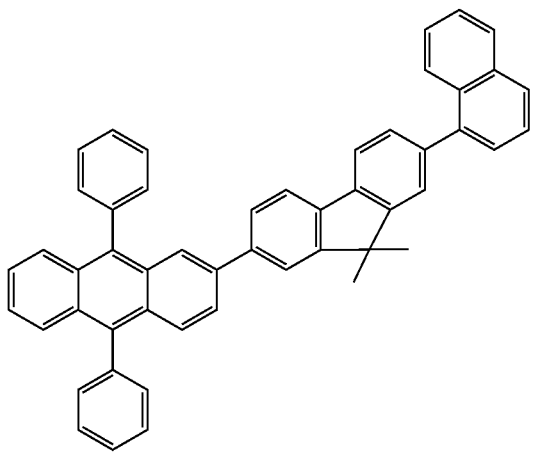
104
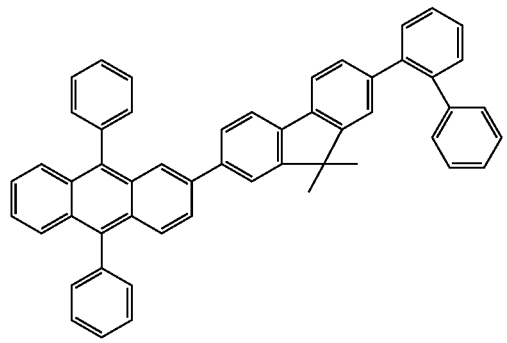
105
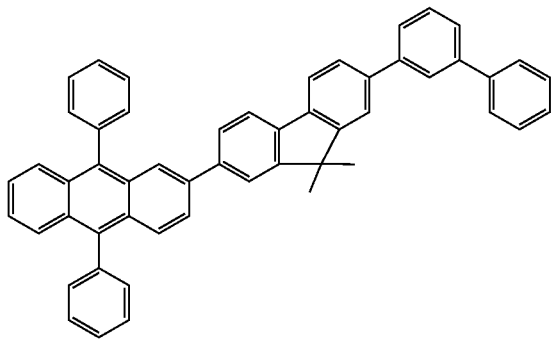
106

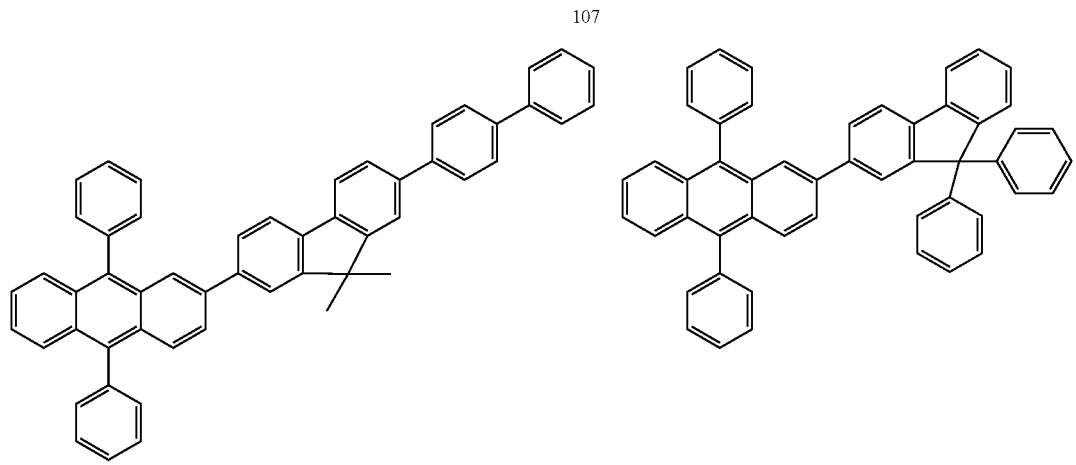
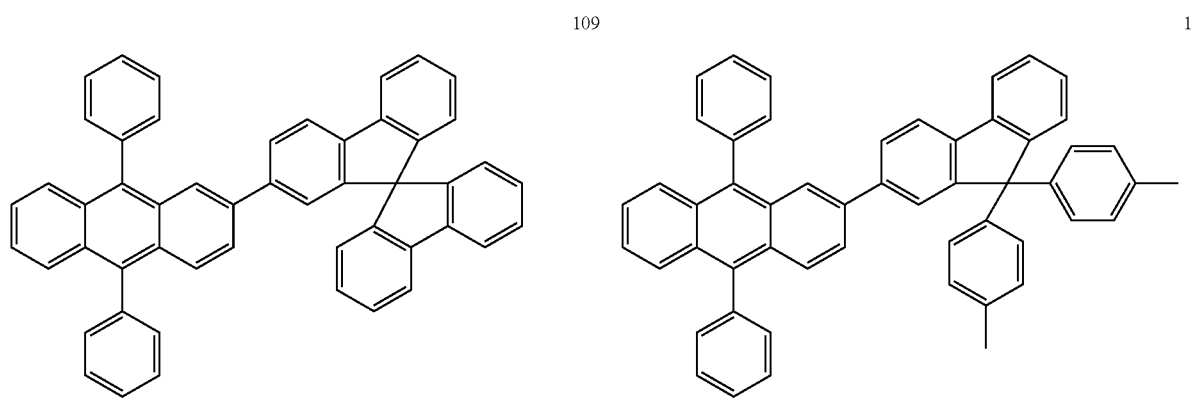
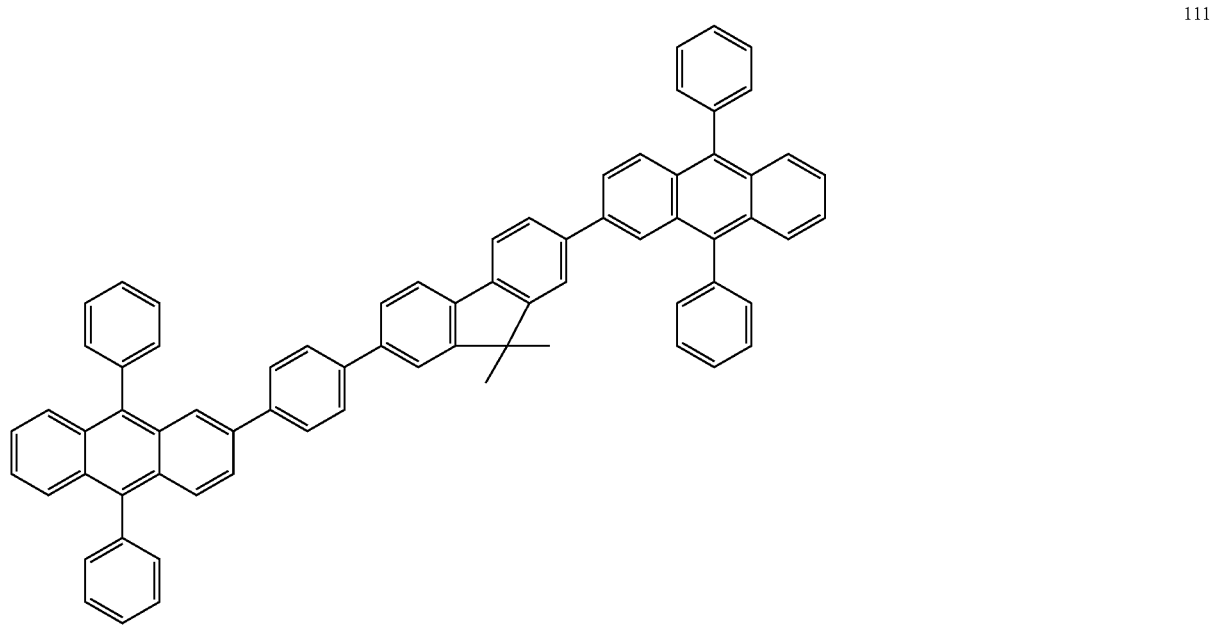

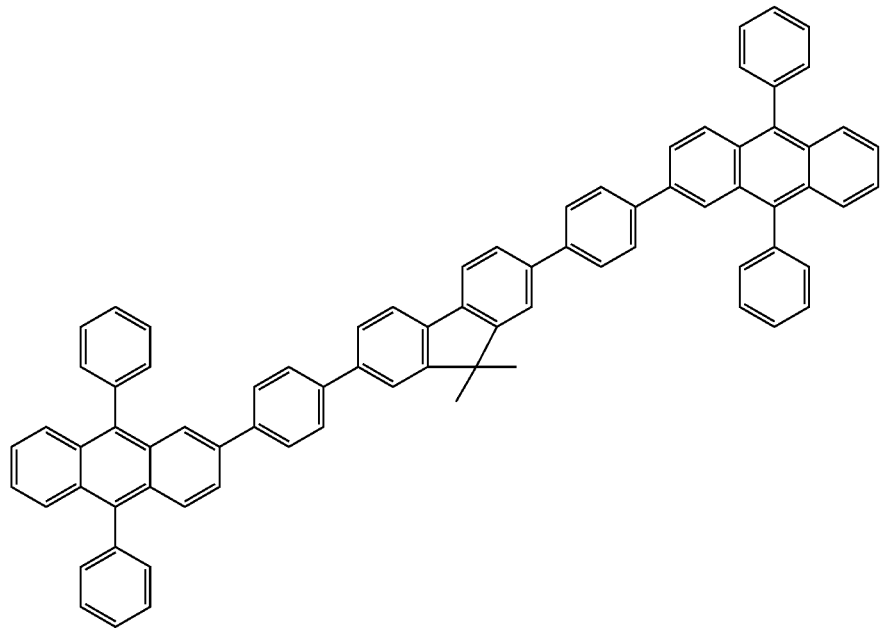
112
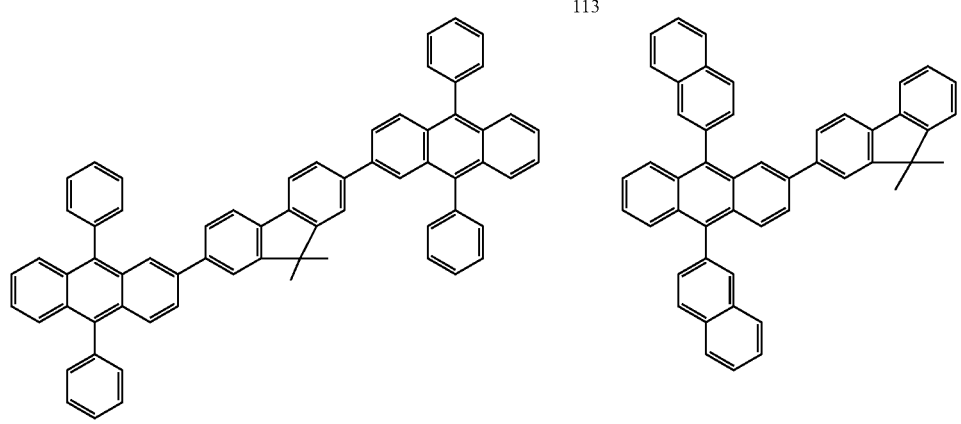
113
201
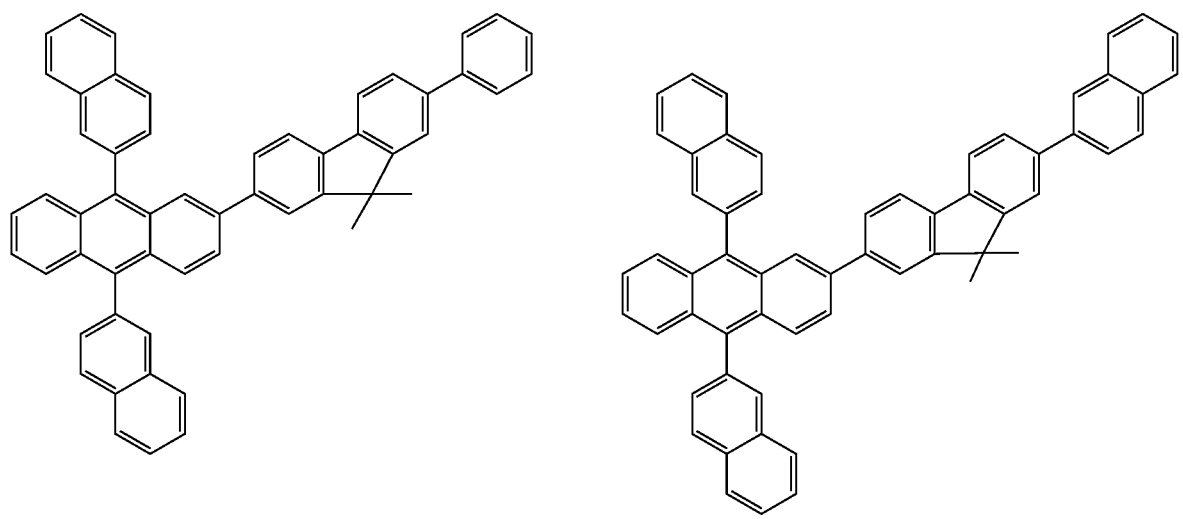
202
203

204
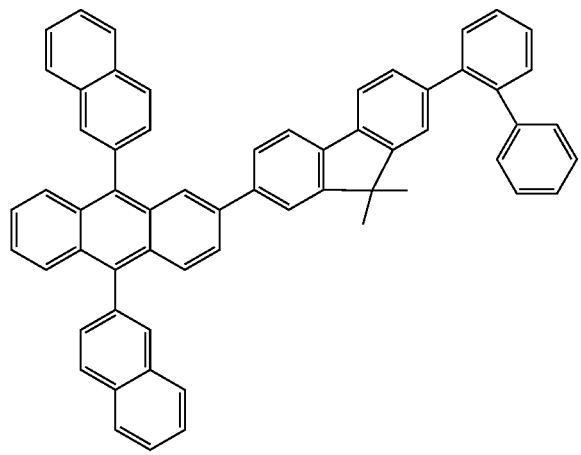
205
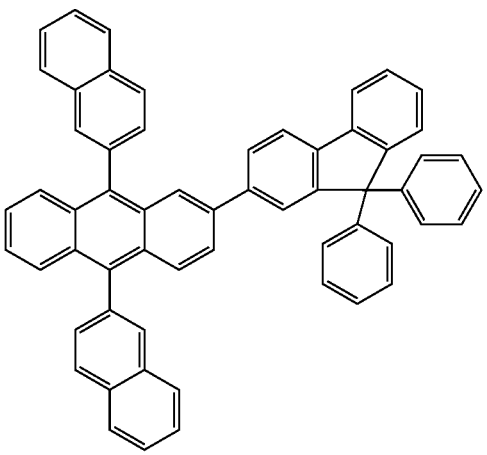
206
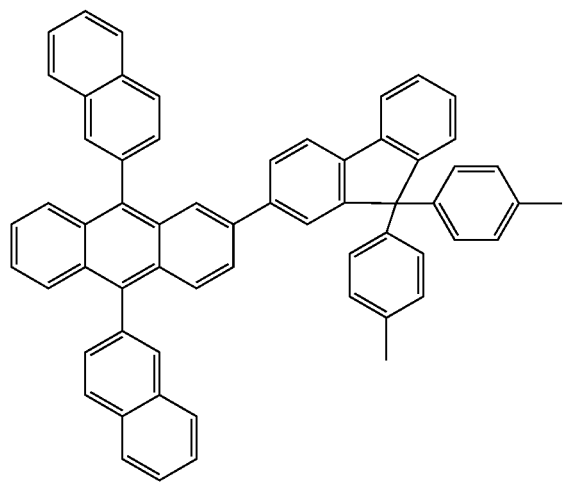
207
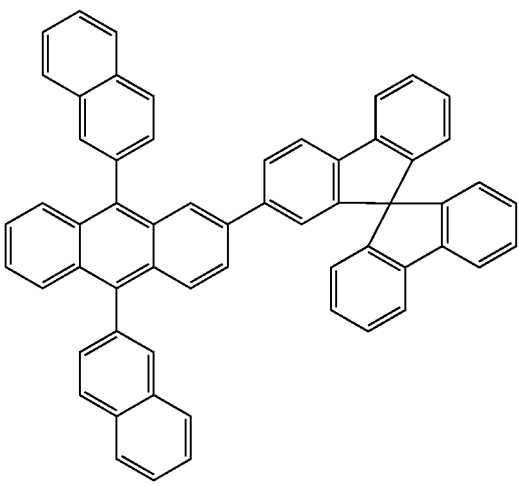
208
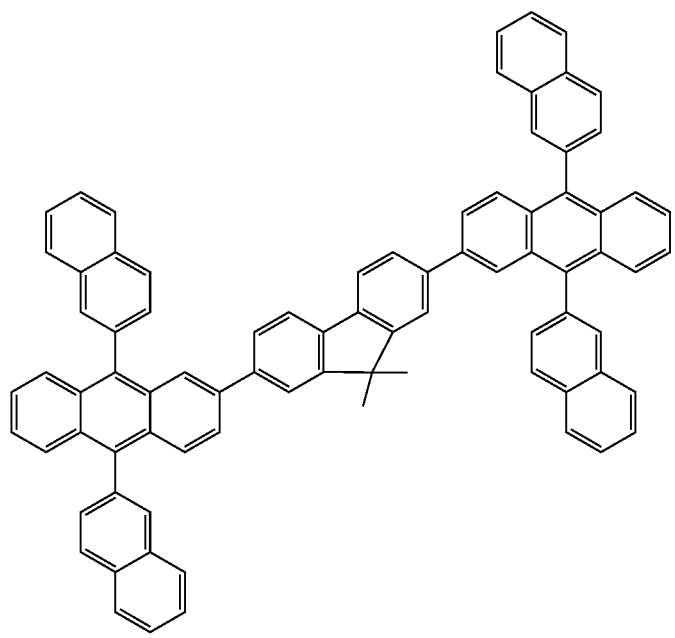

-continued
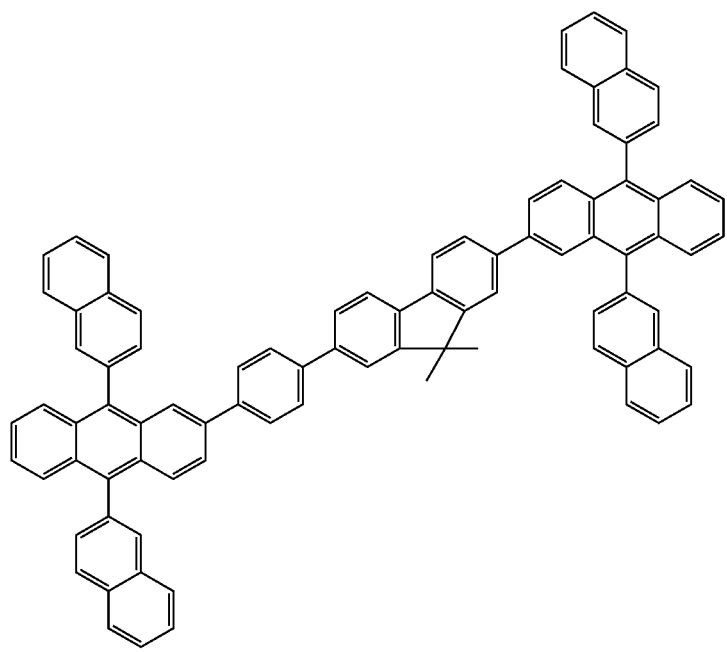
209
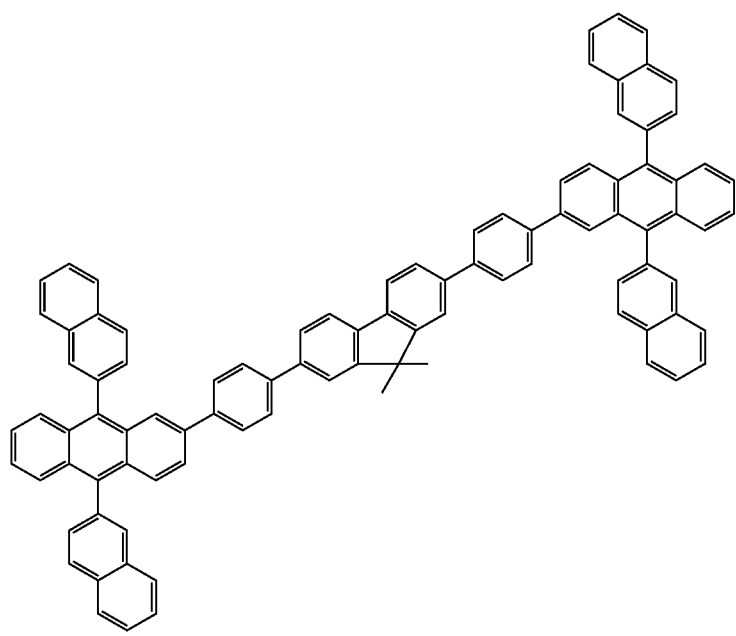
210
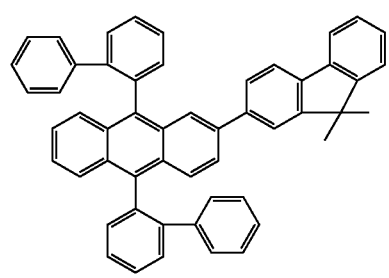
301
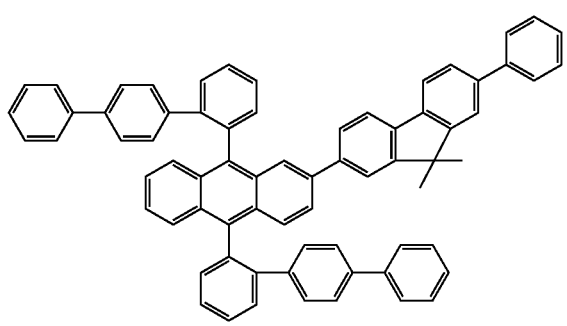
302

-continued
303
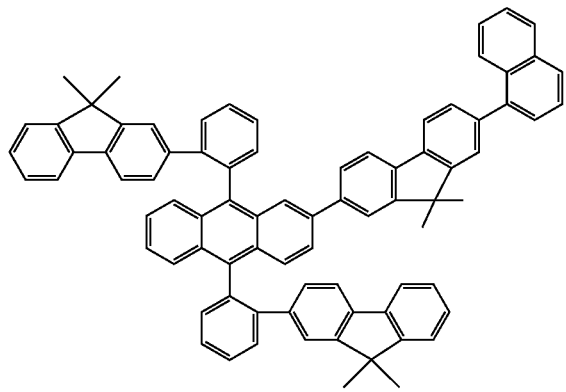
304
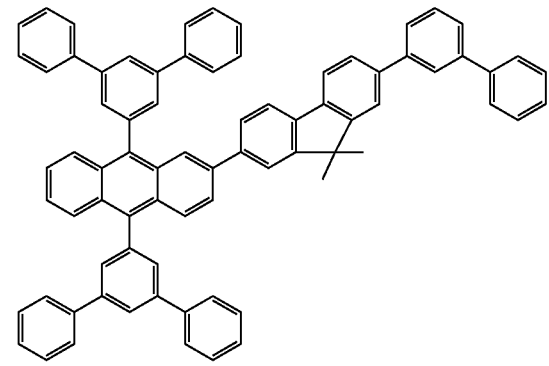
305
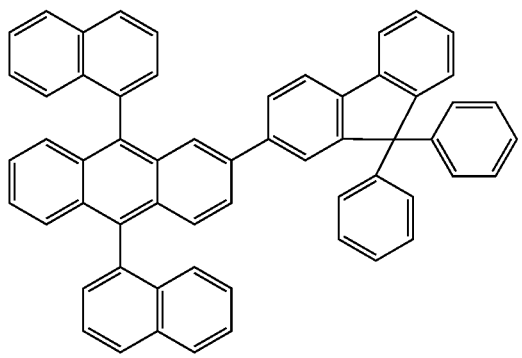
306
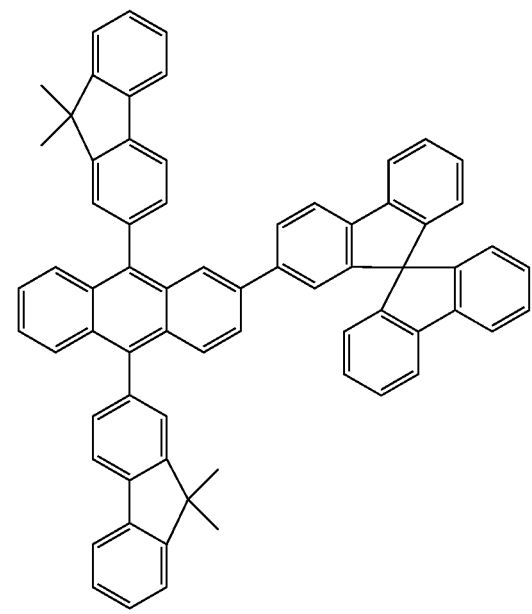
307
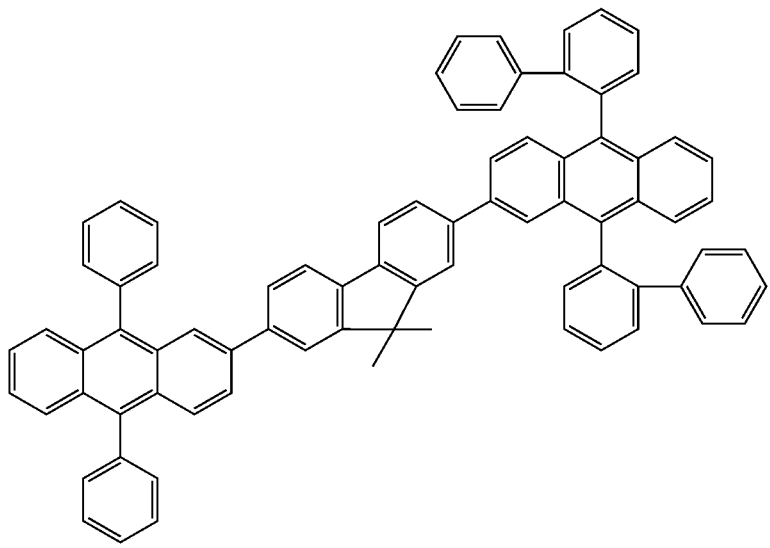

-continued
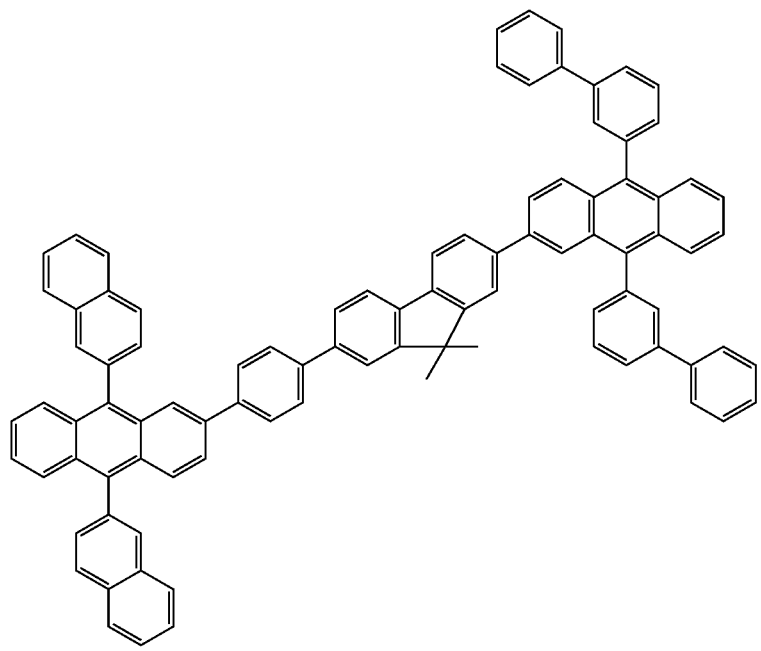
308
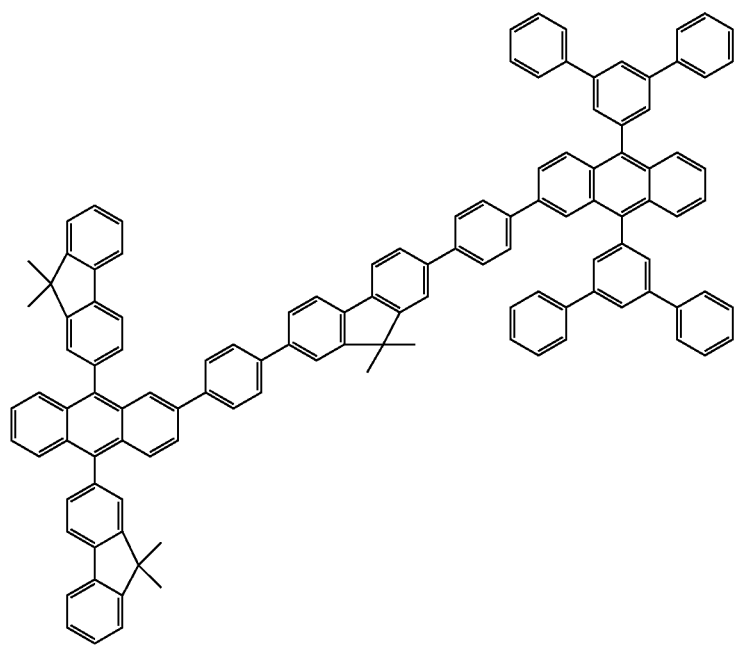
309
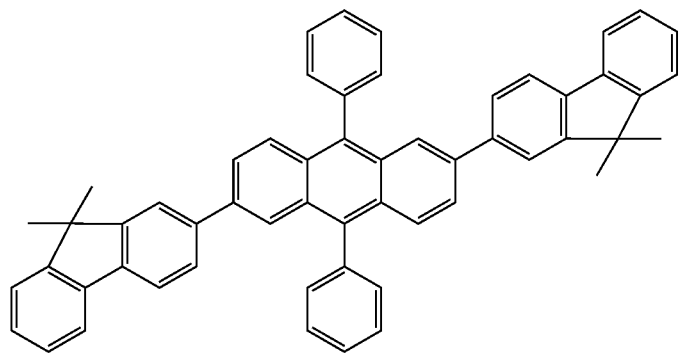
401

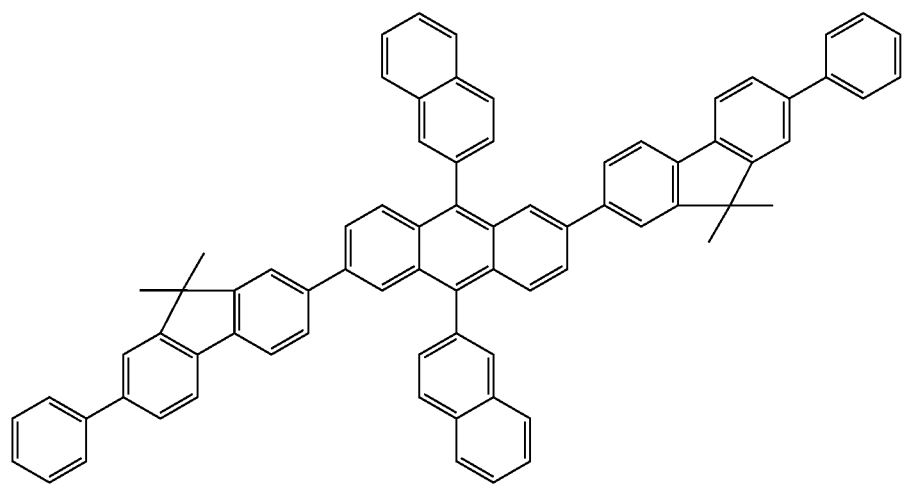
402
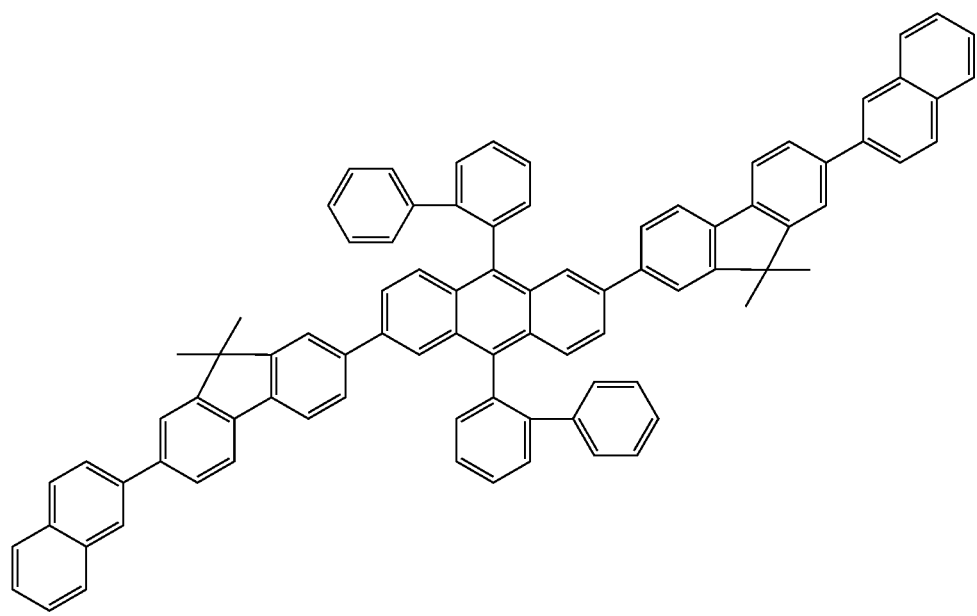
403
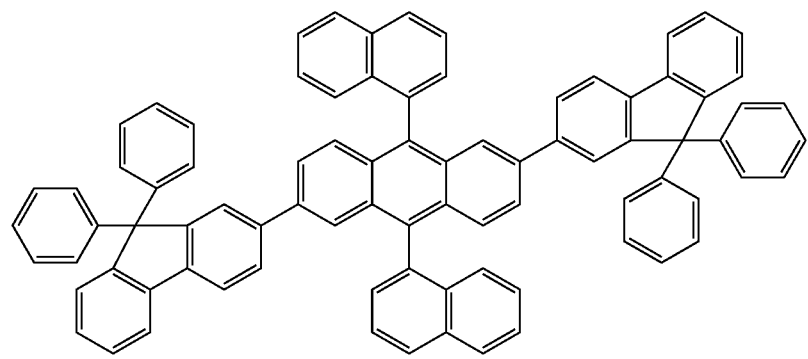
404

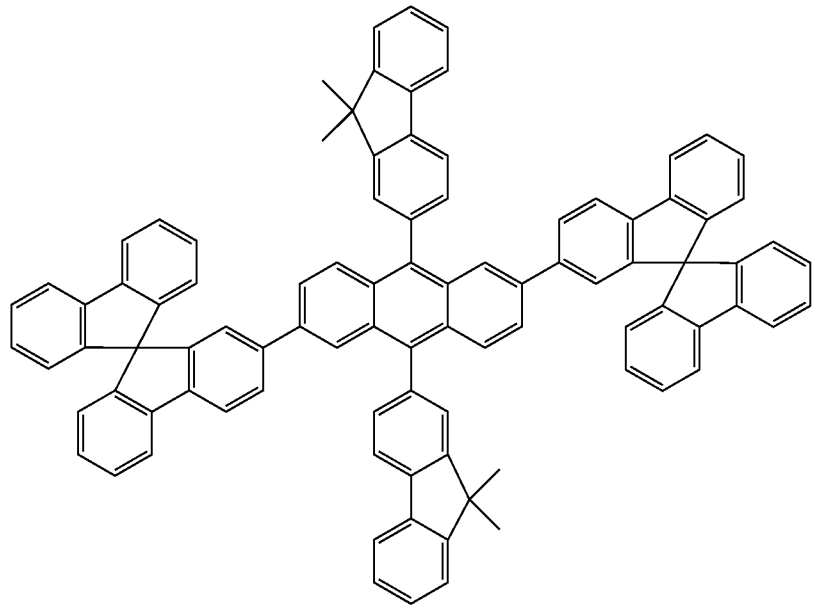

405

MODE FOR INVENTION

Practical and presently preferred embodiments of the present invention are illustrative as shown in the following Examples and Comparative Examples.

However, it will be appreciated that those skilled in the art, on consideration of this disclosure, may make modifications and improvements within the spirit and scope of the present invention.

Synthesis Example 1

Preparation of Compound 101

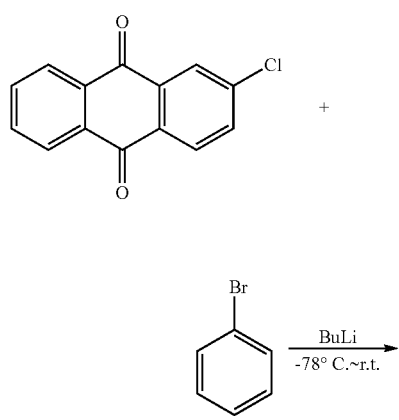

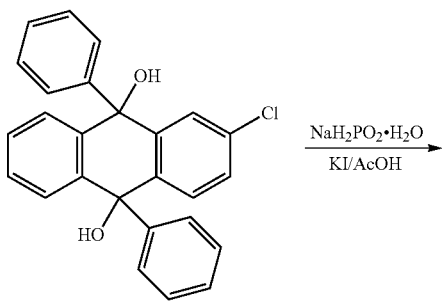

-continued

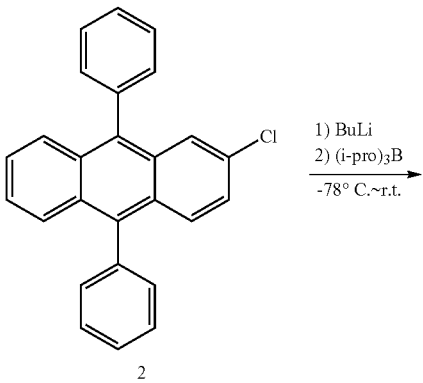

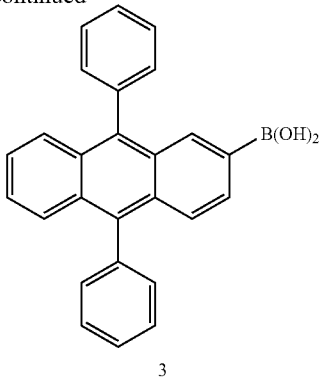

3

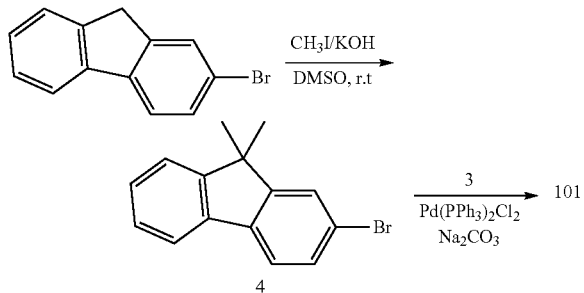

To bromobenzene (388 g, 2.47 mol) was added tetrahydrofuran (3.5 L, 0.3 M), followed by stirring for 10 minutes at room temperature. Upon completion of dissolution, temperature was lowered to −72° C. to which n-butyllithium (1.6 M in n-hexane) (1.7 L, 2.68 mol) was slowly added. One hour later, 2-chloroanthraquinone (250 g, 1.03 mol) was added, and then temperature was raised to room temperature, followed by stirring for 24 hours. To the reaction solution was added 1 L of 10% HCl solution, which was stirred for 2 hours and filtered under the reduced pressure. The organic layer was separated and evaporated to give brown transparent oily compound 1 (226 g, 55%).

$^1$H NMR (200 MHz, CDCl$_3$): δ (ppm)=7.17-7.20 (m, 14H), 7.31 (d, 2H), 7.35 (s, 1H)

MS/FAB: 398.61 (found), 398.88 (calculated)

To compound 1 (226 g, 0.56 mol) were added potassium iodide (376 g, 2.27 mol), sodium phosphatemonohydrate (480 g, 0.45 mol) and acetic acid (1.9 L, 0.3 M), followed by reflux. 18 hours later, the mixture was cooled down at room temperature and filtered under the reduced pressure. To the solid product were added small amount of potassium carbonate, dichloromethane and distilled water for neutralization. After 2 hours of stirring, the organic layer was separated and evaporated to give dark yellow solid compound 2 (97.2 g, 47%).

$^1$H NMR (200 MHz, CDCl$_3$): δ (ppm)=7.23 (t, 2H), 7.31-7.32 (m, 6H), 7.34 (d, 1H), 7.49 (d, 4H), 7.65 (d, 2H), 7.68 (d, 1H), 7.70 (s, 1H)

MS/FAB: 364.95 (found), 364.86 (calculated)

To compound 2 (97.2 g, 0.27 mol) was added tetrahydrofuran (0.89 L, 0.3 M), followed by stirring for 10 minutes at room temperature. Upon completion of dissolution, temperature was lowered to −72° C. to which n-butyllithium (1.6 M in n-hexane) (0.216 L, 0.35 mol) was slowly added. One hour later, triisopropylborate (80.2 g, 0.43 mol) was added to the mixture and temperature was slowly raised to room temperature, followed by stirring for 24 hours. To the reaction solution was added 0.5 L of 10% HCl solution, which was stirred for 2 hours and filtered under the reduced pressure. The organic layer was separated, evaporated and recrystallized by using hexane and methanol to give apricot colored solid compound 3 (36.9 g, 37%).

$^1$H NMR (200 MHz, CDCl$_3$): δ (ppm)=7.21 (t, 2H), 7.28 (d, 1H), 7.30-7.32 (m, 6H), 7.48 (d, 4H), 7.65 (d, 2H), 7.70 (d, 1H), 7.72 (s, 1H)

MS/FAB: 374.58 (found), 374.23 (calculated)

2-bromofluorene (20 g, 82 mmol), iodomethane (35 g, 0.25 mol), potassium hydroxide (13.8 g, 0.25 mol) and dimethylsulfoxide (0.16 L, 0.5 M) were all mixed, followed by stirring at room temperature. 24 hours later, 0.2 L of 10% HCl solution was added to the mixture, which was then stirred for 10 minutes and filtered under the reduced pressure. The solid product was recrystallized by using hexane and methanol to give yellow solid compound 4 (14.75 g, 54%).

$^1$H NMR (200 MHz, CDCl$_3$): δ (ppm)=1.65 (s, 6H), 7.25 (t, 1H), 7.30 (t, 1H), 7.52-53 (d, 2H), 7.71-73 (d, 2H), 7.81 (s, 1H)

MS/FAB: 272.09 (found), 273.16 (calculated)

Compound 3 (10 g, 26.72 mmol), compound 4 (8.76 g, 32.06 mmol), trans-dichlorobis(triphenylphosphine)palladium (II) (0.38 g, 0.54 mmol), sodium carbonate (5.67 g, 53.44 mmol), toluene (0.1 L, 0.3 M) and distilled water (9 mL, 3 M) were all mixed, followed by reflux. 22 hours later, reaction temperature was lowered to room temperature and 0.1 L of distilled water was added thereto to terminate the reaction. The solid product was filtered under the reduced pressure. The solid product proceeded onto silica gel column chromatography (dichloromethane n-Hexane=1:10) to give yellow solid compound 101 (8.52 g, 61%).

$^1$H NMR (200 MHz, CDCl$_3$): δ (ppm)=1.66 (s, 6H), 7.20 (t, 2H), 7.30-7.47 (m, 12H), 7.51-7.58 (m, 3H), 7.68-7.71 (m, 3H), 7.75 (s, 1H), 7.84-7.85 (s, 2H), 7.92 (s, 1H)

MS/FAB: 522.80 (found), 522.67 (calculated)

Synthesis Example 2

Preparation of Compound 102

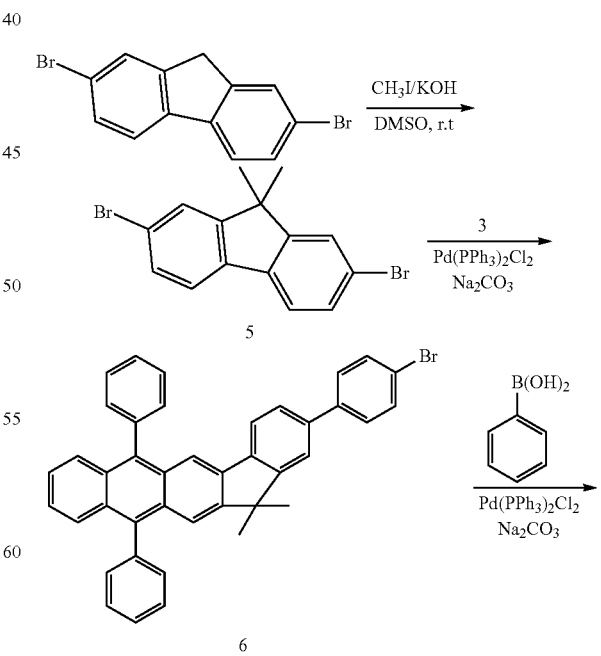

2,7-dibromofluorene (146 g, 0.45 mol), iodomethane (192 g, 1.351 mol), potassium hydroxide (76 g, 1.351 mol), and dimethylsulfoxide (1.125 L, 0.4 M) were added to distilled water (1.125 L, 0.4 M), followed by stirring at room temperature. 24 hours later, 2 L of 10% HCl solution was added to the mixture, which was stirred for 10 minutes and filtered under the reduced pressure. The obtained oil proceeded onto silica gel column chromatography (dichloromethane:n-Hexane=1:10) to give pink solid compound 5 (93 g, 59%).

$^1$H NMR (200 MHz, CDCl$_3$): δ (ppm)=1.65 (s, 6H), 7.54 (d, 2H), 7.70-7.73 (d, 4H)

MS/FAB: 351.67 (found), 352.06 (calculated)

Compound 3 (23 g, 61.46 mmol), compound 5 (21.64 g, 61.46 mmol), trans-dichlorobistriphenylphosphinpaladium (II) (0.216 g, 0.307 mmol), sodium carbonate (7.82 g, 73.75 mmol), toluene (0.2 L, 0.3 M) and distilled water (20 mL, 3 M) were all mixed, followed by reflux. 26 hours later, reaction temperature was lowered to room temperature and 0.2 L of distilled water was added thereto to terminate the reaction. The solid product was filtered under the reduced pressure. The solid product proceeded onto silica gel column chromatography (Ethylacetate:n-Hexane=1:15) to give yellow solid compound 6 (9.6 g, 26%).

$^1$H NMR (200 MHz, CDCl$_3$): δ (ppm)=1.66 (s, 6H), 7.20 (t, 2H), 7.30-7.41 (m, 10H), 7.52-7.54 (d, 2H), 7.62-7.64 (m, 3H), 7.71-7.76 (m, 4H), 7.87 (s, 1H), 7.91 (d, 1H)

MS/FAB: 601.26 (found), 601.57 (calculated)

compound 6 (9.6 g, 15.96 mmol), phenylboronic acid (2.34 g, 19.15 mmol), trans-dichlorobis(triphenylphosphine)palladium (II) (0.224 g, 0.32 mmol), sodium carbonate (3.38 g, 31.92 mmol), toluene (53 mL, M) and distilled water (5.3 mL, 3 M) were all mixed, followed by reflux. 18 hours later, reaction temperature was lowered to room temperature and 0.05 L of distilled water was added thereto to terminate the reaction. The solid product was filtered under the reduced pressure. The solid product proceeded onto silica gel column chromatography (Ethylacetate:n-Hexane=1:5) to give yellow solid compound 102 (3.92 g, 41%).

$^1$H NMR (200 MHz, CDCl$_3$): δ (ppm)=1.65 (s, 6H), 7.21 (t, 3H), 7.31-7.43 (m, 14H), 7.54-7.68 (m, 5H), 7.73-7.76 (d, 3H), 7.89-7.91 (d, 3H)

MS/FAB: 598.12 (found), 598.77 (calculated)

Synthesis Example 3

Preparation of Compound 108

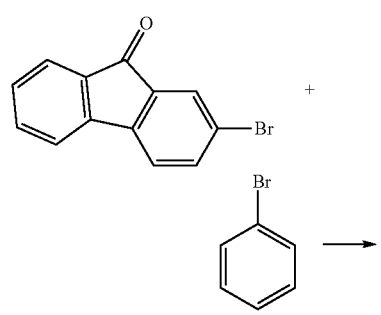

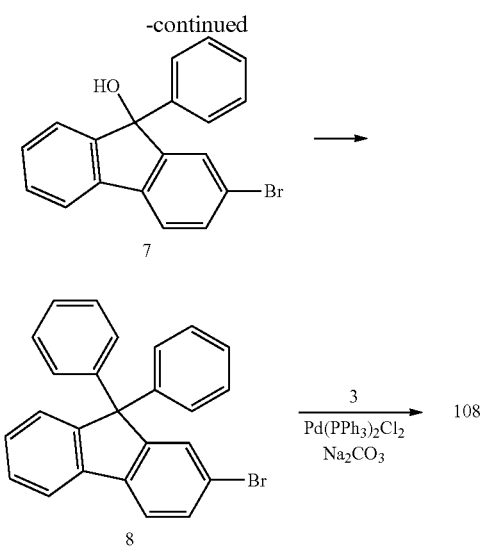

To magnesium (4.9 g, 0.2 mol) was added diethyl ether (0.05 L, 2 M), to which bromobenzene (31.4 g, 0.2 mol) which was diluted in diethyl ether (0.15 L, 0.67M) was slowly added, followed by reflux for 3 hours with stirring. 2-bromofluorenone (25.9 g, mol) was dissolved in diethyl ether (0.04 L, 2.5 M), which was loaded in the above mixture during the reflux by using a syringe. 12 hours later, the reaction was terminated. The precipitate was filtered under the reduced pressure to give compound 7 (15 g, 18%).

$^1$H NMR (200 MHz, CDCl$_3$) δ (ppm)=7.18 (d, 2H), 7.20-7.26 (m, 4H 7.36 (t, 1H), 7.54 (d, 2H), 7.71-7.73 (d, 2H), 7.83 (d, 1H)

MS/FAB: 337.01 (found), 337.20 (calculated)

Compound 7 (15 g, 36 mmol) was dissolved in benzene (0.145 L, 0.25 M) and heated. Methanesulfonic acid (6.6 mL, 72 mmol) was slowly added thereto during the heating. 30 minutes later, the reaction was terminated. The product was recrystallized by using methanol and petroleum diethyl ether to give compound 8 (9.58 g, 67%).

$^1$H NMR (200 MHz, CDCl$_3$): δ (ppm)=7.05-7.08 (m, 6H), 7.13-7.15 (m, 4H), 7.27 (t, 1H), 7.36 (t, 1H), 7.54 (d, 2H), 7.71-7.73 (d, 2H), 7.83 (d, 1H)

MS/FAB: 396.89 (found), 397.30 (calculated)

Compound 3 (6.94 g, 18.55 mmol) prepared in Synthesis Example 1, compound 8 (9.58 g, 24.11 mmol), trans-dichlorobis(triphenylphosphine)palladium (II) (0.39 g, 0.56 mmol), sodium carbonate (4.92 g, 46.38 mmol), toluene (62 mL, 0.3 M) and distilled water (6.2 mL, 3 M) were all mixed, followed by reflux with stirring. 45 hours later, reaction temperature was lowered to room temperature, to which 0.06 L of distilled water was added to terminate reaction. The solid product was filtered under the reduced pressure. The obtained solid was recrystallized by using diethyl ether, hexane and methanol and proceeded onto silica gel column chromatography (dichloromethane:n-Hexane=1:3) to give yellow solid compound 108 (4.56 g, 38%).

$^1$H NMR (200 MHz, CDCl$_3$): δ (ppm)=7.05-7.08 (m, 6H), 7.17-7.28 (m, 7H), 7.34-7.46 (m, 11H), 7.54-7.60 (m, 3H), 7.68-7.74 (m, 4H), 7.86-7.90 (m, 3H)

MS/FAB: 646.77 (found), 646.81 (calculated)

Synthesis Example 4

Preparation of Compound 109

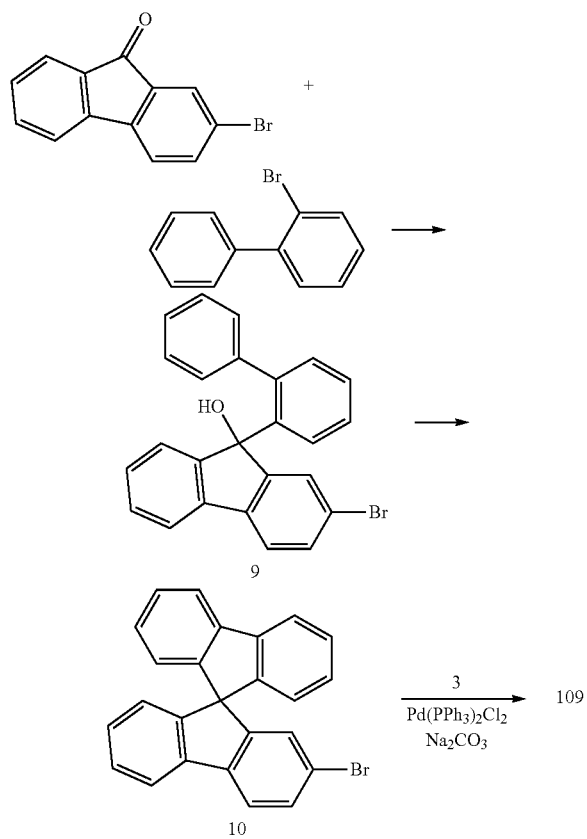

To magnesium (1.86 g, 25.6 mmol) was added diethyl ether (10 mL, 2 M), to which 2-bromobiphenyl (5 g, 21.6 mmol) which was diluted in diethyl ether (20 mL, 1 M) was slowly added, followed by reflux for 3 hours with stirring. 2-bromofluorenone (5.2 g, mmol) was dissolved in diethyl ether (40 mL, 0.5 M), which was added into the above mixture during the reflux by using a syringe. 12 hours later, the reaction was terminated. The solid product was filtered and dissolved in 40 mL of acetic acid solution, followed by reflux. HCl solution was slowly added thereto. 4 hours later, the reaction was terminated. The obtained solid was filtered under the reduced pressure, washed with water and methanol and recrystallized by using dichloromethane and n-hexane to give compound 10 (6.85 g, 66%).

$^1$H NMR (200 MHz, CDCl$_3$): δ (ppm)=7.15-7.20 (m, 4H), 7.26 (t, 2H) 7.36-7.38 (m, 4H), 7.54 (d, 2H), 7.72-7.73 (d, 2H), 7.86 (d, 1H)

MS/FAB: 394.76 (found), 395.29 (calculated)

Compound 3 (4.99 g, 13.33 mmol) prepared in Synthesis Example 1, compound 10 (6.85 g, 17.3 mmol), trans-dichlorobis(triphenylphosphine)palladium (II) (0.28 g, 0.40 mmol), sodium carbonate (3.53 g, 33.33 mmol), toluene (40 mL, M) and distilled water (4 mL, 3.3 M) were all mixed, followed by reflux with stirring. 61 hours later, reaction temperature was lowered to room temperature, to which 0.05 L of distilled water was added to terminate reaction. The solid product was filtered under the reduced pressure. The obtained solid was recrystallized by using diethyl ether, hexane and methanol and proceeded onto silica gel column chromatography (dichloromethane:n-hexane=1:5) to give apricot colored solid compound 109 (1.8 g, 21%).

$^1$H NMR (200 MHz, CDCl$_3$): δ (ppm)=7.18-7.22 (m, 6H), 7.34-7.46 (m, 14H), 7.54-7.56 (d, 2H), 7.61-7.65 (m, 4H), 7.73-7.76 (d, 2H), 7.85 (d, 2H), 7.90-7.91 (d, 2H)

MS/FAB: 644.39 (found), 644.79 (calculated)

Synthesis Example 5

Preparation of Compound 112

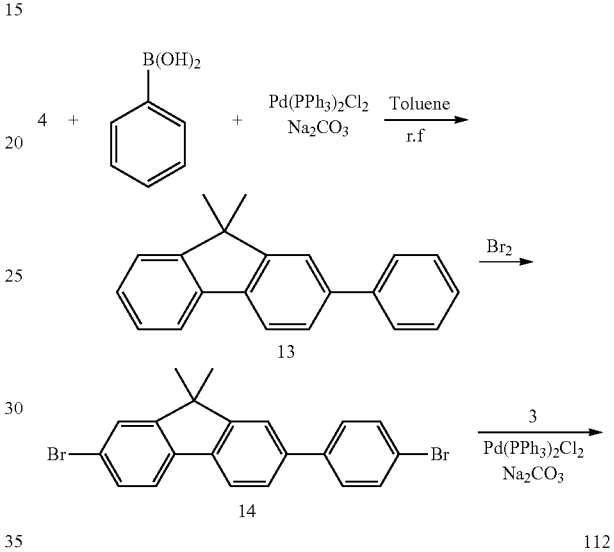

compound 4 (16 g, 58 mmol), phenylboronic acid (10.6 g, 87 mmol), trans-dichlorobis(triphenylphosphine)palladium (II) (4.11 g, 5.8 mmol), sodium carbonate (31.04 g, 290 mmol), toluene (300 mL) and distilled water (30 mL) were all mixed, followed by reflux with stirring. 12 hours later, extraction was performed using water and dichloromethane, followed by distillation under the reduced pressure. The product proceeded onto silica gel column chromatography (Ethylacetate:n-Hexane=1:10) to give white solid compound 13 (7.5 g, 48%).

$^1$H NMR (200 MHz, CDCl$_3$): δ (ppm)=1.65 (s, 6H), 7.23-7.26 (t, 2H), 7.34-7.38 (t, 3H), 7.50-7.55 (m, 3H), 7.62 (d, 1H), 7.78 (s, 1H), 7.87 (d, 1H), 7.92 (d, 1H)

MS/FAB: 270.64 (found), 270.36 (calculated)

Compound 13 (3.4 g, 12 mmol) was dissolved in dichloromethane (0.05 L, 0.24 M), to which phosphobromide (1.42 mL, 27 mmol) diluted in dichloromethane (50 mL) was slowly added at 0° C. 2 hours later, reaction temperature was raised to 25° C. followed by stirring for 24 hours. The reaction solution was neutralized with potassium hydroxide solution, followed by extraction with 200 mL of dichloromethane. The extract was distilled under the reduced pressure, washed with hexane, and filtered under the reduced pressure to give compound 14 (4.78 g, 93%).

$^1$H NMR (200 MHz, CDCl$_3$): δ (ppm)=1.66 (s, 6H), 7.38 (d, 2H), 7.48 (d, 2H), 7.57 (d, 1H), 7.61 (d, 1H), 7.70-7.72 (d, 2H), 7.76 (s, 1H), 7.90 (d, 1H)

MS/FAB: 428.36 (found), 428.15 (calculated)

Compound 3 (3.48 g, 9.3 mmol) prepared in Synthesis Example 1, compound 14 (1.66 g, 3.88 mmol), trans-dichlorobis(triphenylphosphine)palladium (II) (0.218 g, 0.31 mmol), sodium carbonate (0.99 g, 9.3 mmol), toluene (20 mL) and distilled water (2 mL) were all mixed, followed by reflux with stirring. 36 hours later, reaction temperature was lowered to room temperature, to which 20 mL of distilled water was added to terminate reaction. Then, extraction was performed using dichloromethane, followed by distillation under the reduced pressure. The solid product proceeded onto silica gel column chromatography (dichloromethane:n-hexane=1:4) to give yellow solid compound 112 (1.8 g, 50%).

$^1$H NMR (200 MHz, CDCl$_3$) δ (ppm)=1.67 (s, 6H), 7.25-7.47 (m, 24H), 7.56-7.66 (m, 12H), 7.76-7.92 (m, 8H)

MS/FAB: 927.01 (found), 927.17 (calculated)

Synthesis Example 6

Preparation of Compound 113

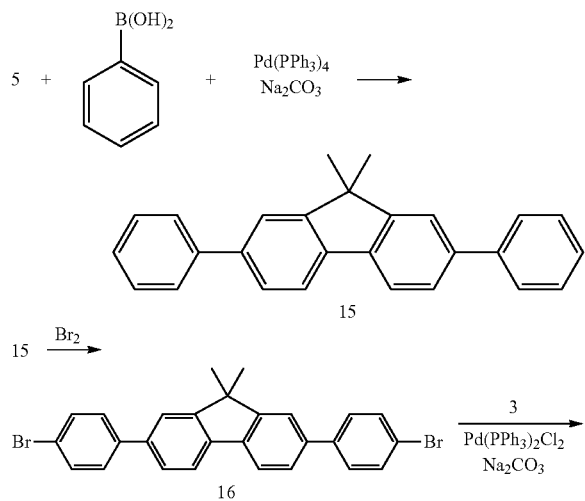

Compound 5 (30 g, 85.2 mmol), phenylboronic acid (22.8 g, 187.44 mmol), tetrakis(triphenylphosphine)palladium (0) (4.9 g, 4.26 mmol), sodium carbonate (72 g, 682 mmol), toluene (500 mL) and distilled water (30 mL) were all mixed, followed by reflux with stirring. 12 hours later, extraction was performed using 100 mL of water and 200 mL of ethyl acetate, followed by distillation under the reduced pressure. The product was recrystallized by using dichloromethane and methanol, and proceeded onto silica gel column chromatography (dichloromethane:n-hexane=1:10) to give yellow solid compound 15 (14 g, 47%).

$^1$H NMR (200 MHz, CDCl$_3$) δ (ppm)=1.65 (s, 6H), 7.20 (t, 2H), 7.34 (t, 4H), 7.50 (d, 4H), 7.62 (d, 2H), 7.79 (s, 2H), 7.91 (d, 2H)

MS/FAB: 346.97 (found), 346.46 (calculated)

Compound 15 (3.2 g, 9.24 mmol) was dissolved in dichloromethane (70 mL), to which phosphobromide (0.973 mL, 18.5 mmol) diluted in dichloromethane (70 mL) was slowly added at 0° C. 2 hours later, reaction temperature was raised to 25° C. followed by stirring for 24 hours. The reaction solution was neutralized with potassium hydroxide solution, followed by extraction with 260 mL of dichloromethane. The extract was recrystallized by using distilled water, washed with hexane, and filtered under the reduced pressure to give compound 16 (3.91 g, 83%).

$^1$H NMR (200 MHz, CDCl$_3$): δ (ppm)=1.67 (s, 6H), 7.36 (d, 4H), 7.48 (d, 4H), 7.61 (d, 2H), 7.76 (s, 2H), 7.89 (d, 2H)

MS/FAB: 504.37 (found), 504.25 (calculated)

Compound 3 (7.24 g, 19.34 mmol) prepared in Synthesis Example 1, compound 16 (3.9 g, 7.7 mmol), trans-dichlorobis(triphenylphosphine)palladium (II) (0.43 g, 0.62 mmol), sodium carbonate (2.46 g, 23.2 mmol), toluene (65 mL) and distilled water (6.5 mL) were all mixed, followed by reflux with stirring. 38 hours later, reaction temperature was lowered to room temperature, to which 60 mL of distilled water was added to terminate reaction. Then, extraction was performed using 250 mL of dichloromethane, followed by distillation under the reduced pressure. The extract was recrystallized by using methanol and acetone. The solid product proceeded onto silica gel column chromatography (dichloromethane:n-hexane=1:4) to give yellow solid compound 113 (3.03 g, 39%).

$^1$H NMR (200 MHz, CDCl$_3$): δ (ppm)=1.63 (s, 6H), 7.18-7.48 (m, 24H), 7.56-7.59 (m, 12H), 7.69-7.75 (m, 8H), 7.88-7.90 (d, 4H)

MS/FAB: 1003.65 (found), 1003.27 (calculated)

| No. | $^1$H NMR (200 MHz, CDCl$_3$): δ (ppm) |
|---|---|
| 101 | 1.66 (s, 6H), 7.20 (t, 2H), 7.30-7.47 (m, 12H), 7.51-7.58 (m, 3H), 7.68-7.71 (m, 3H), 7.75 (s, 1H), 7.84-7.85 (s, 2H), 7.92 (s, 1H) |
| 102 | 1.65 (s, 6H), 7.21 (t, 3H), 7.31-7.43 (m, 14H), 7.54-7.68 (m, 5H), 7.73-7.76 (d, 3H), 7.89-7.91 (d, 3H) |
| 103 | 1.64 (s, 6H), 7.21 (t, 2H), 7.34-7.46 (m, 12H), 7.53-7.55 (d, 2H), 7.60-7.66 (m, 6H), 7.74-7.78 (m, 4H), 7.88-7.91 (m, 4H) |
| 104 | 1.64 (s, 6H), 7.22 (t, 2H), 7.35-7.48 (m, 13H), 7.54-7.57 (d, 2H), 7.62-7.68 (m, 7H), 7.75-7.79 (m, 3H), 7.88-7.90 (m, 3H) |
| 105 | 1.67 (s, 6H), 7.21-7.25 (m, 5H), 7.33-7.48 (m, 14H), 7.56-7.60 (m, 5H), 7.69-7.76 (m, 4H), 7.87-7.91 (m, 4H) |
| 106 | 1.65 (s, 6H), 7.20-7.24 (m, 5H), 7.31-7.47 (m, 16H), 7.54-7.59 (m, 4H), 7.68-7.77 (m, 4H), 7.89-7.92 (m, 3H) |
| 107 | 1.66 (s, 6H), 7.21-7.24 (m, 5H), 7.31-7.45 (m, 16H), 7.54-7.61 (m, 4H), 7.68-7.75 (m, 4H), 7.88-7.90 (m, 3H) |
| 108 | 7.05-7.08 (m, 6H), 7.17-7.28 (m, 7H), 7.34-7.46 (m, 11H), 7.54-7.60 (m, 3H), 7.68-7.74 (m, 4H), 7.86-7.90 (m, 3H) |
| 109 | 7.18-7.22 (m, 6H), 7.34-7.46 (m, 14H), 7.54-7.56 (d, 2H), 7.61-7.65 (m, 4H), 7.73-7.76 (d, 2H), 7.85 (d, 2H), 7.90-7.91 (d, 2H) |
| 110 | 2.33 (s, 6H), 6.93-6.96 (m, 8H), 7.24-7.48 (m, 14H), 7.53-7.55 (d, 2H), 7.63-7.68 (m, 4H), 7.74-7.78 (d, 2H), 7.88-7.91 (d, 2H) |
| 111 | 1.65 (s, 6H), 7.21 (t, 4H), 7.34-7.47 (m, 22H), 7.55 (d, 2H), 7.61 (d, 2H), 7.68-7.72 (t, 6H), 7.88-7.90 (t, 4H) |
| 112 | 1.67 (s, 6H), 7.25-7.47 (m, 24H), 7.56-7.66 (m, 12H), 7.76-7.92 (m, 8H) |
| 113 | 1.63 (s, 6H), 7.18-7.48 (m, 24H), 7.56-7.59 (m, 12H), 7.69-7.75 (m, 8H), 7.88-7.90 (d, 4H) |

Synthesis Example 7

Preparation of Compound 201

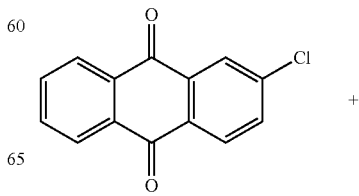

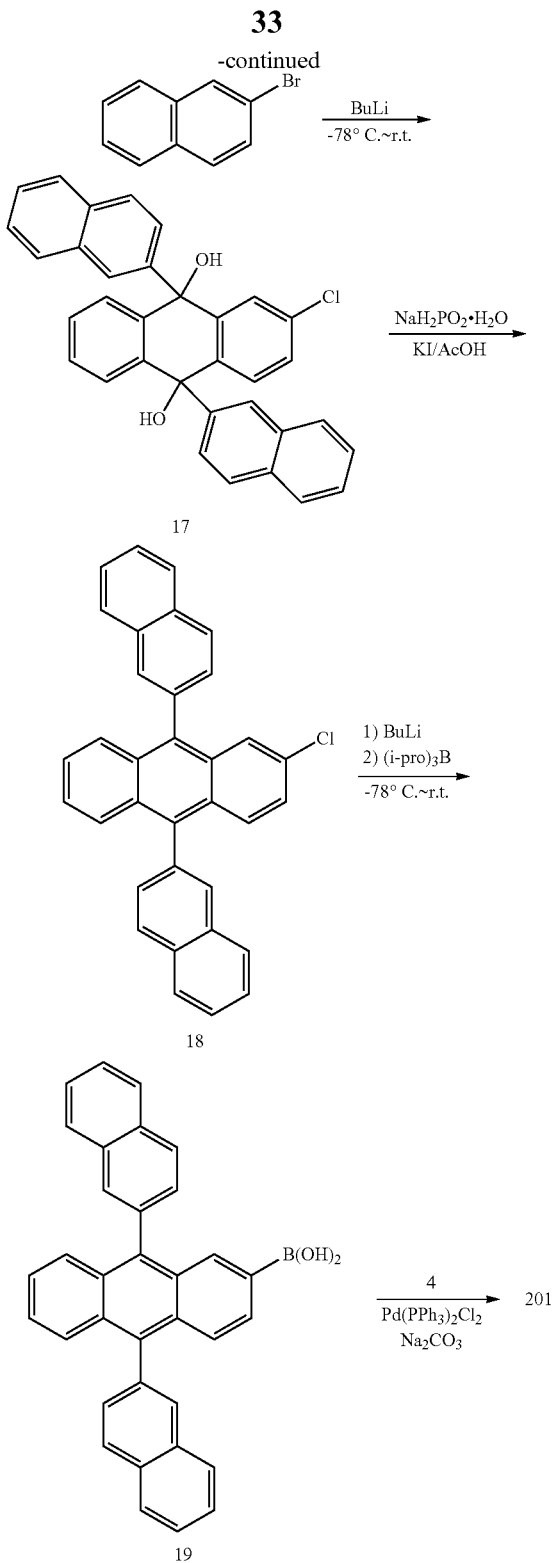

added saturated ammonium chloride solution, which was stirred for 1 hour and filtered under the reduced pressure. The organic layer was separated and evaporated to give brown solid compound 17 (551 g, 67%).

¹H NMR (200 MHz, CDCl₃): δ (ppm)=7.17-7.20 (m, 16H), 7.31 (d, 3H), 7.35 (s, 2H)

MS/FAB: 498.13 (found), 498.99 (calculated)

To compound 17 (551 g, 1.104 mol) were added potassium iodide (733 g, 4.42 mol), sodium phosphatemonohydrate (937 g, 8.8 mol) and acetic acid (3.35 L, 0.33 M), followed by reflux with stirring. 21 hours later, the mixture was cooled down at room temperature and filtered under the reduced pressure. To the solid product were added small amount of potassium carbonate and distilled water for neutralization. After 2 hours of stirring, the organic layer was separated and evaporated to give light green solid compound 18 (318 g, 62%).

¹H NMR (200 MHz, CDCl₃): δ (ppm)=7.23 (t, 2H), 7.31-7.34 (m, 8H), 7.37 (d, 1H), 7.49 (d, 4H), 7.65 (d, 3H), 7.68 (d, 2H), 7.73 (s, 1H)

MS/FAB: 465.15 (found), 464.98 (calculated)

To compound 18 (318 g, 0.68 mol) was added tetrahydrofuran (2.3 L), followed by stirring for 10 minutes at room temperature. Upon completion of dissolution, temperature was lowered to −72° C. to which n-butyllithium (1.6 M in n-hexane) (0.56 L, 0.89 mol) was slowly added. One hour later, triisopropylborate (206 g, 1.09 mol) was added to the mixture and temperature was slowly raised to room temperature, followed by stirring for 24 hours. To the reaction solution was added 2 L of 10% HCl solution, which was stirred for 2 hours and filtered under the reduced pressure. The organic layer was separated, evaporated and recrystallized by using hexane and methanol to give apricot colored solid compound 19 (188 g, 58%).

¹H NMR (200 MHz, CDCl₃): δ (ppm)=7.21 (t, 2H), 7.27 (d, 1H), 7.30-7.34 (m, 8H), 7.47 (d, 4H), 7.66 (d, 3H), 7.72 (d, 2H), 7.74 (s, 1H)

MS/FAB: 474.11 (found), 474.35 (calculated)

Compound 19 (11 g, 23.19 mmol), compound 4 (7.6 g, 27.83 mmol), trans-dichlorobis(triphenylphosphine)palladium (II) (0.326 g, 0.464 mmol), sodium carbonate (5.41 g, 51.02 mmol), toluene (100 mL) and distilled water (10 mL) were all mixed, followed by reflux with stirring. 30 hours later, reaction temperature was lowered to room temperature and 100 mL of distilled water was added thereto to terminate the reaction. The solid product was filtered under the reduced pressure. The obtained solid was recrystallized by using hexane and methanol to give yellow solid compound 201 (8.52 g, 61%).

¹H NMR (200 MHz, CDCl₃): δ (ppm)=1.66 (s, 6H), 7.20 (t, 2H), 7.30-7.47 (m, 14H), 7.51-7.57 (m, 4H), 7.68-7.71 (m, 3H), 7.77 (s, 2H), 7.84-7.88 (s, 2H), 7.93 (s, 1H)

MS/FAB: 622.62 (found), 622.79 (calculated)

To 2-bromonaphthalene (819 g, 3.96 mol) was added tetrahydrofuran (5 L), followed by stirring for 10 minutes at room temperature. Upon completion of dissolution, temperature was lowered to −72° C. to which n-butyllithium (1.6 M in n-hexane) (2.68 L, 4.285 mol) was slowly added. One hour later, 2-chloroanthraquinone (400 g, 1.648 mol) was added, and then temperature was raised to room temperature, followed by stirring for 26 hours. To the reaction solution was

| No. | ¹H NMR (200 MHz, CDCl₃): δ (ppm) |
|---|---|
| 201 | 1.66 (s, 6H), 7.20 (t, 2H), 7.30-7.47 (m, 14H), 7.51-7.57 (m, 4H), 7.68-7.71 (m, 3H), 7.77 (s, 2H), 7.84-7.88 (s, 2H), 7.93 (s, 1H) |
| 202 | 1.65 (s, 6H), 7.21 (t, 3H), 7.30-7.45 (m, 16H), 7.54-7.69 (m, 6H), 7.74-7.76 (d, 4H), 7.89-7.91 (d, 3H) |
| 203 | 1.64 (s, 6H), 7.21 (t, 2H), 7.32-7.41 (m, 14H), 7.53-7.56 (d, 2H), 7.60-7.67 (m, 8H), 7.74-7.77 (m, 4H), 7.87-7.90 (m, 4H) |
| 204 | 1.67 (s, 6H), 7.20-7.25 (m, 7H), 7.34-7.47 (m, 15H), 7.56-7.61 (m, 6H), 7.69-7.76 (m, 4H), 7.87-7.91 (m, 4H) |
| 205 | 7.05-7.09 (m, 6H), 7.16-7.28 (m, 7H), 7.34-7.48 (m, 13H), 7.54-7.59 (m, 4H), 7.68-7.74 (m, 4H), 7.86-7.91 (m, 4H) |

| No. | $^1$H NMR (200 MHz, CDCl$_3$): δ (ppm) |
|---|---|
| 206 | 7.18-7.22 (m, 6H), 7.34-7.45 (m, 16H), 7.52-7.56 (d, 2H), 7.61-7.67 (m, 4H), 7.73-7.77 (d, 3H), 7.85 (d, 2H), 7.89-7.91 (d, 3H) |
| 207 | 2.33 (s, 6H), 6.93-6.96 (m, 8H), 7.25-7.48 (m, 17H), 7.53-7.55 (d, 2H), 7.65-7.69 (m, 5H), 7.74-7.78 (d, 2H), 7.88-7.91 (d, 2H) |
| 208 | 1.65 (s, 6H), 7.21 (t, 4H), 7.33-7.50 (m, 26H), 7.56 (d, 2H), 7.60 (d, 2H), 7.67-7.71 (t, 10H), 7.89-7.92 (t, 4H) |
| 209 | 1.67 (s, 6H), 7.25-7.49 (m, 28H), 7.57-7.67 (m, 16H), 7.76-7.92 (m, 8H) |
| 210 | 1.63 (s, 6H), 7.16-7.50 (m, 28H), 7.57-7.62 (m, 16H), 7.69-7.75 (m, 8H), 7.88-7.90 (d, 4H) |

Synthesis Example 8

Preparation of Compound 301

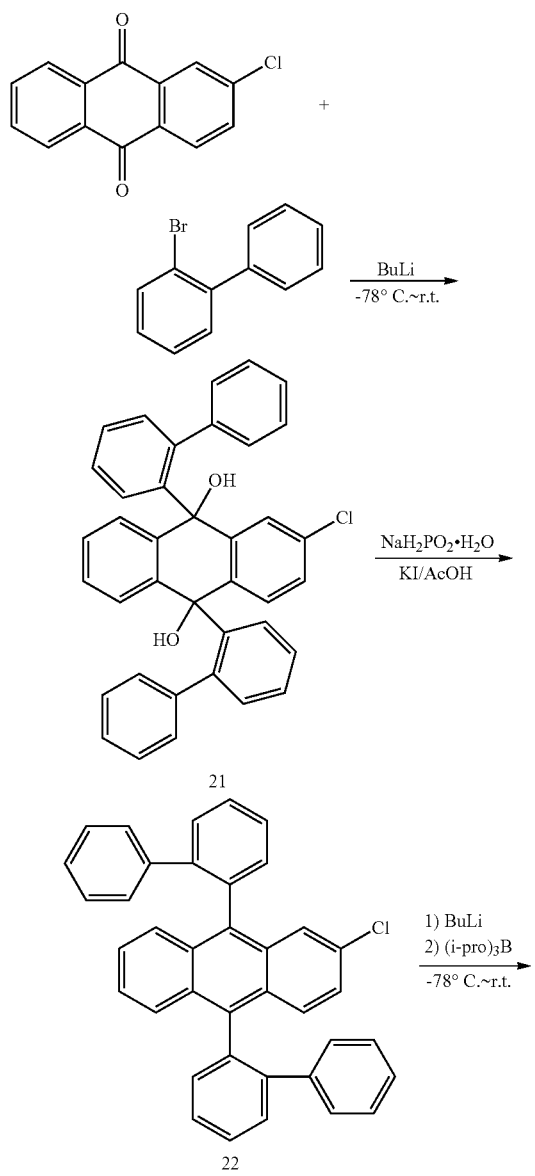

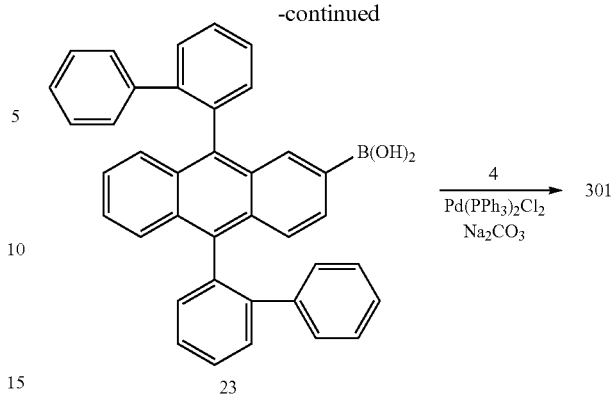

To 2-bromobiphenyl (48 g, 0.206 mol) was added tetrahydrofuran (410 mL), followed by stirring for 10 minutes at room temperature. Upon completion of dissolution, temperature was lowered to −72° C. to which n-butyllithium (1.6 M in n-hexane) (0.14 L, 0.22 mol) was slowly added. One hour later, 2-chloroanthraquinone (20 g, 82 mmol) was added, and then temperature was raised to room temperature, followed by stirring for 12 hours. To the reaction solution was added 0.5 L of 10% HCl solution, which was stirred for 1 hour and filtered under the reduced pressure. The organic layer was obtained using 240 mL of dichloromethane, evaporated under the reduced pressure and recrystallized by using n-hexane to give compound 21 (32.7 g, 72%).

$^1$H NMR (200 MHz, CDCl$_3$): δ (ppm)=7.14-7.26 (m, 12H), 7.31-7.40 (m. 9H), 7.46-7.48 (d, 4H)

MS/FAB: 550.62 (found), 551.07 (calculated)

To compound 21 (32.7 g, 0.06 mol) were added potassium iodide (39.4 g, 0.24 mol), sodium phosphate monohydrate (50.3 g, 0.48 mol) and acetic acid (0.2 L), followed by reflux with stirring. 21 hours later, the mixture was cooled down at room temperature and filtered under the reduced pressure. To the solid product were added small amount of potassium carbonate and distilled water for neutralization. After 2 hours of stirring, the organic layer was separated and evaporated to give white solid compound 22 (9.13 g, 54%).

$^1$H NMR (200 MHz, CDCl$_3$): δ (ppm)=7.21-7.26 (m, 6H), 7.33-7.35 (m. 7H), 7.50-7.53 (m, 8H), 7.62 (d, 1H), 7.66-7.68 (t, 3H)

MS/FAB: 517.60 (found), 517.05 (calculated)

To compound 22 (9.13 g, 17.66 mmol) was added tetrahydrofuran (60 mL), followed by stirring for 10 minutes at room temperature. Upon completion of dissolution, temperature was lowered to −72° C., to which n-butyllithium (1.6 M in n-hexane) (14.6 mL, 22.95 mmol) was slowly added. One hour later, triisopropylborate (5.32 g, 28.26 mmol) was added to the mixture and temperature was slowly raised to room temperature, followed by stirring for 22 hours. To the reaction solution was added 0.1 L of 10% HCl solution, which was stirred for 1 hour and filtered under the reduced pressure. The organic layer was obtained using 150 mL of ethyl acetate, evaporated under the reduced pressure and recrystallized by using hexane and methanol to give apricot colored solid compound 23 (3.81 g, 41%).

$^1$H NMR (200 MHz, CDCl$_3$): δ (ppm)=7.21-7.25 (m, 6H), 7.33-7.35 (m. 7H), 7.50-7.55 (m, 8H), 7.61 (d, 1H), 7.65-7.69 (t, 3H)

MS/FAB: 525.89 (found), 526.43 (calculated)

Compound 23 (3.81 g, 7.24 mmol), compound 4 (2.37 g, 8.68 mmol), trans-dichlorobis(triphenylphosphine)palladium (II) (0.26 g, 0.36 mmol), sodium carbonate (1.54 g, 14.48 mmol), toluene (40 mL) and distilled water (3.6 mL) were all mixed, followed by reflux with stirring. 46 hours later, reaction temperature was lowered to room temperature and 40 mL of distilled water was added thereto to terminate the reaction. The solid product was filtered under the reduced pressure. The obtained solid was recrystallized by using hexane and methanol, and proceeded onto silica gel column chromatography (dichloromethane:n-hexane=1:1) to give white solid compound 301 (1.61 g, 33%).

$^1$H NMR (200 MHz, CDCl$_3$): δ (ppm)=1.65 (s, 6H), 7.19 (t, 2H), 7.32-7.46 (m, 16H), 7.53-7.57 (m, 6H), 7.67-7.71 (m, 3H), 7.79 (s, 2H), 7.85-7.88 (s, 2H), 7.92 (s, 1H)

MS/FAB: 674.24 (found), 674.86 (calculated)

Synthesis Example 9

Preparation of Compound 302

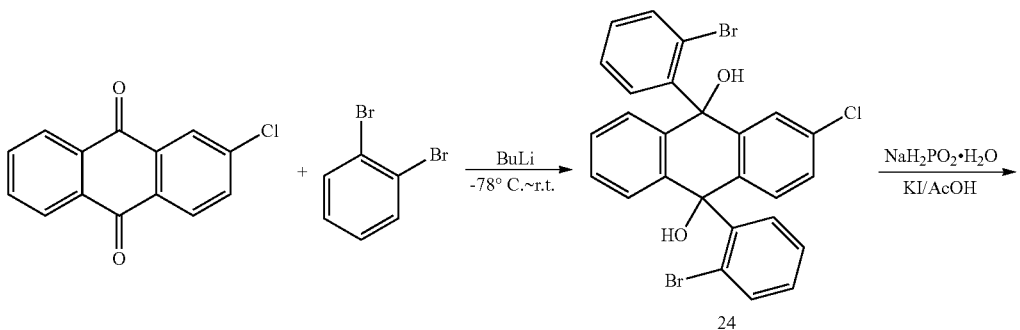

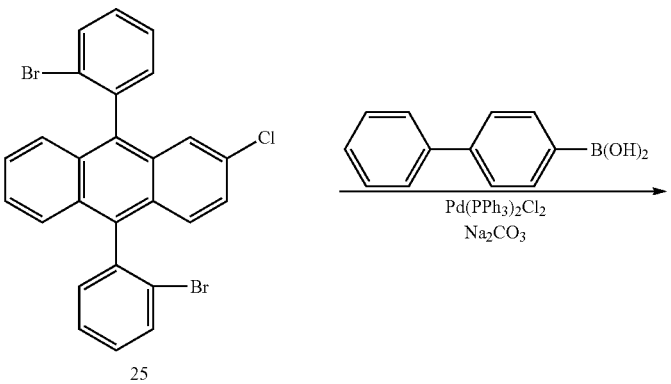

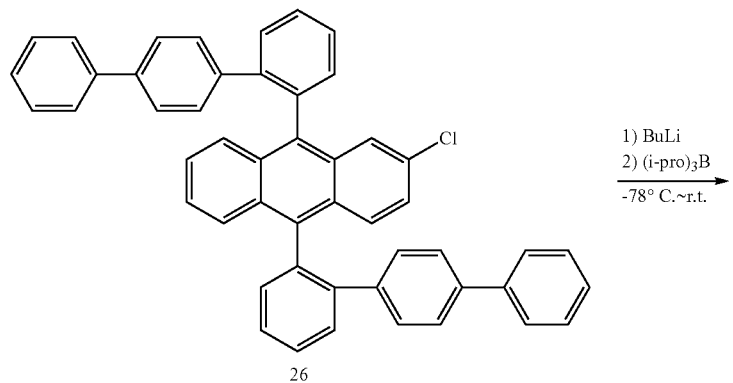

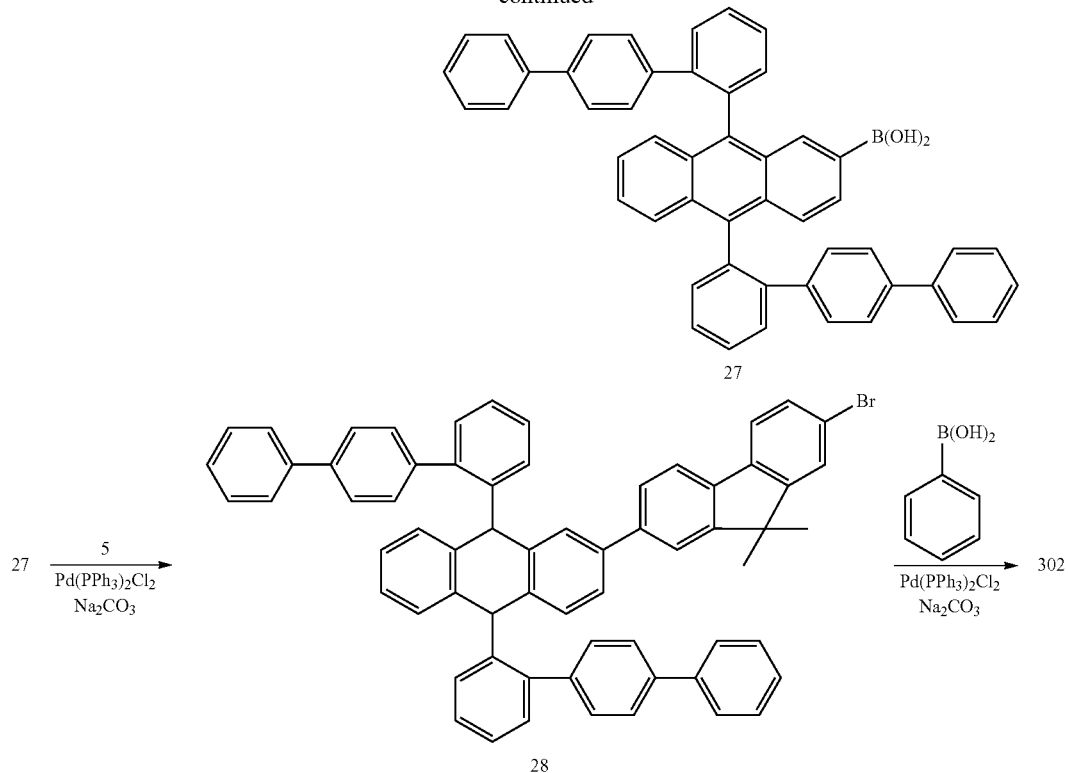

To 1,2-dibromobenzene (70 g, 0.3 mol) was added tetrahydrofuran (620 mL), followed by stirring for 10 minutes at room temperature. Upon completion of dissolution, temperature was lowered to −72° C. to which n-butyllithium (1.6 M in n-hexane) (200 mL, 0.321 mol) was slowly added. One hour later, 2-chloroanthraquinone (30 g, 0.12 mol) was added, and then temperature was raised to room temperature, followed by stirring for 21 hours. To the reaction solution was added 500 mL of 10% HCl solution, which was stirred for 1 hour and filtered under the reduced pressure. The organic layer was obtained by using 300 mL of dichloromethane, evaporated and recrystallized by using n-hexane and methanol to give compound 24 (44.04 g, 64%).

$^1$H NMR (200 MHz, CDCl$_3$): δ (ppm)=7.10 (t, 4H), 7.14 (t, 2H), 7.20 (t, 3H), 7.26 (d, 2H), 7.37 (m, 4H)

MS/FAB: 556.33 (found), 556.67 (calculated)

To compound 24 (44 g, 79.04 mmol) were added potassium iodide (26.24 g, 158 mmol), sodium phosphate monohydrate (41.9 g, 395 mmol) and acetic acid (0.26 L, 0.3 M), followed by reflux with stirring. 24 hours later, the mixture was cooled down at room temperature and filtered under the reduced pressure. To the solid product were added small amount of potassium carbonate and distilled water for neutralization. After 2 hours of stirring, the organic layer was separated, evaporated and recrystallized by using n-hexane and methanol to give apricot colored solid compound 25 (20.2 g, 49%).

$^1$H NMR (200 MHz, CDCl$_3$) δ (ppm)=7.11 (t, 4H), 7.16 (t, 2H), 7.21 (t, 3H), 7.27 (d, 2H), 7.39 (m, 4H)

MS/FAB: 522.02 (found), 522.65 (calculated)

Compound 25 (20 g, 38.27 mmol), 4-biphenylboronic acid (21.4 g, 91.84 mmol), trans-dichlorobis(triphenylphosphine)palladium (II) (0.1.34 g, 1.91 mmol), sodium carbonate (12.17 g, 114.8 mmol), toluene (190 mL) and distilled water (20 mL) were all mixed, followed by reflux with stirring. 51 hours later, reaction temperature was lowered to room temperature and 200 mL of distilled water was added thereto to terminate the reaction. The solid product was filtered under the reduced pressure. The obtained solid was recrystallized by using hexane and methanol, and proceeded onto silica gel column chromatography (dichloromethane:n-hexane=1:10) to give yellow solid compound 26 (13.31 g, 52%).

$^1$H NMR (200 MHz, CDCl$_3$): δ (ppm)=7.22-7.26 (m, 8H), 7.33-7.38 (m. 11H), 7.49-7.54 (m, 10H), 7.62 (d, 1H), 7.66-7.68 (t, 3H)

MS/FAB: 668.75 (found), 669.25 (calculated)

To compound 26 (13 g, 19.42 mmol) was added tetrahydrofuran (100 mL), followed by stirring for 10 minutes at room temperature. Upon completion of dissolution, temperature was lowered to −72° C. to which n-butyllithium (1.6 M in n-hexane) (17 mL, 27.2 mmol) was slowly added. One hour later, triisopropylborate (6.58 g, 34.96 mmol) was added to the mixture and temperature was slowly raised to room temperature, followed by stirring for 19 hours. To the reaction solution was added 100 mL of 10% HCl solution, which was stirred for 2 hours and filtered under the reduced pressure. The solid product was recrystallized by using n-hexane and methanol to give white solid compound 27 (4.74 g, 36%).

$^1$H NMR (200 MHz, CDCl$_3$): δ (ppm)=7.21-7.26 (m, 8H), 7.32-7.38 (m. 11H), 7.49-7.53 (m, 10H), 7.60 (d, 1H), 7.67-7.70 (t, 3H)

MS/FAB: 678.27 (found), 678.62 (calculated)

Compound 5 (2.93 g, 8.31 mmol), compound 27 (4.7 g, 6.93 mmol), trans-dichlorobis(triphenylphosphine)palladium (II) (0.34 g, 0.49 mmol), sodium carbonate (1.47 g, 13.86 mmol), toluene (40 mL) and distilled water (3.5 mL) were all mixed, followed by reflux with stirring. 25 hours later, reaction temperature was lowered to room temperature and 50 mL of distilled water was added thereto to terminate the reaction. The solid product was filtered under the reduced pressure. The obtained solid proceeded onto silica gel column chromatography (ethylacetate:n-hexane=1:8) to give apricot colored solid compound 28 (4.58 g, 73%).

$^1$H NMR (200 MHz, CDCl$_3$): δ (ppm)=1.68 (s, 6H), 7.22-7.26 (m, 3H), 7.33-7.41 (m, 19H), 7.50-7.56 (m, 8H), 7.66-7.71 (m, 4H), 7.81 (s, 2H), 7.83-7.85 (s, 2H), 7.90 (s, 1H)

MS/FAB: 904.67 (found), 905.95 (calculated)

Compound 28 (4.58 g, 5.06 mmol), phenylboronic acid (0.74 g, 6.07 mmol), trans-dichlorobis(triphenylphosphine) palladium (II) (0.18 g, 0.25 mmol), sodium carbonate (1.3 g, 12.14 mmol), toluene (40 mL) and distilled water (3.5 mL) were all mixed, followed by reflux with stirring. 30 hours later, reaction temperature was lowered to room temperature, to which 50 mL of distilled water was added to terminate reaction. Then, extraction was performed using 300 mL of dichloromethane, followed by distillation under the reduced pressure. The solid product proceeded onto silica gel column chromatography (ethylacetate:n-hexane=1:8), and was recrystallized by using methanol to give white solid compound 302 (2.47 g, 54%).

$^1$H NMR (200 MHz, CDCl$_3$): δ (ppm)=1.67 (s, 6H), 7.22-7.25 (m, 4H), 7.32-7.40 (m, 21H), 7.49-7.56 (m, 10H), 7.65-7.70 (m, 4H), 7.79 (s, 2H), 7.82-7.84 (s, 2H), 7.89 (s, 1H)

MS/FAB: 903.79 (found), 903.15 (calculated)

| No. | $^1$H NMR (200 MHz, CDCl$_3$): δ (ppm) |
|-----|----------------------------------------|
| 301 | 1.65 (s, 6H), 7.19 (t, 2H), 7.32-7.46 (m, 16H), 7.53-7.57 (m, 6H), 7.67-7.71 (m, 3H), 7.79 (s, 2H), 7.85-7.88 (s, 2H), 7.92 (s, 1H) |
| 302 | 1.67 (s, 6H), 7.22-7.25 (m, 4H), 7.32-7.40 (m, 21H), 7.49-7.56 (m, 10H), 7.65-7.70 (m, 4H), 7.79 (s, 2H), 7.82-7.84 (s, 2H), 7.89 (s, 1H) |
| 303 | 1.64 (s, 18H), 7.25-7.37 (m, 14H), 7.52-7.63 (m, 12H), 7.69-7.74 (m, 9H), 7.82 (d, 4H), 7.91 (d, 3H) |
| 304 | 1.65 (s, 6H), 7.23-7.31 (m, 23H), 7.48-7.52 (m, 12H), 7.63-7.69 (m, 11H), 7.86 (d, 2H) |
| 305 | 7.08-7.11 (m, 6H), 7.17-7.25 (m, 7H), 7.37-7.49 (m, 13H), 7.53-7.60 (m, 4H), 7.69-7.75 (m, 4H), 7.87-7.92 (m, 4H) |
| 306 | 1.66 (s, 12H), 7.15 (t, 2H), 7.19-7.23 (m, 6H), 7.30-7.38 (m, 14H), 7.46 (s, 2H), 7.58 (d, 4H), 7.79 (d, 3H), 7.83 (d, 3H), 7.91 (d, 2H) |
| 307 | 1.66 (s, 6H), 7.22 (t, 6H), 7.33-7.47 (m, 26H), 7.55 (d, 2H), 7.62 (d, 2H), 7.68-7.73 (t, 8H), 7.88-7.90 (t, 4H) |
| 308 | 1.65 (s, 6H), 7.23-7.50 (m, 30H), 7.58-7.67 (m, 18H), 7.76-7.92 (m, 8H) |
| 309 | 1.67 (s, 18H), 7.20-7.24 (m, 7H), 7.31-7.50 (m, 34H), 7.54-7.60 (m, 9H), 7.65-7.68 (m, 8H), 7.75 (d, 5H), 7.84 (d, 2H), 7.91 (d, 3H) |

Synthesis Example 10

Preparation of Compound 401

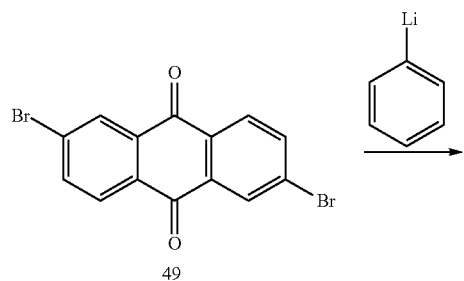

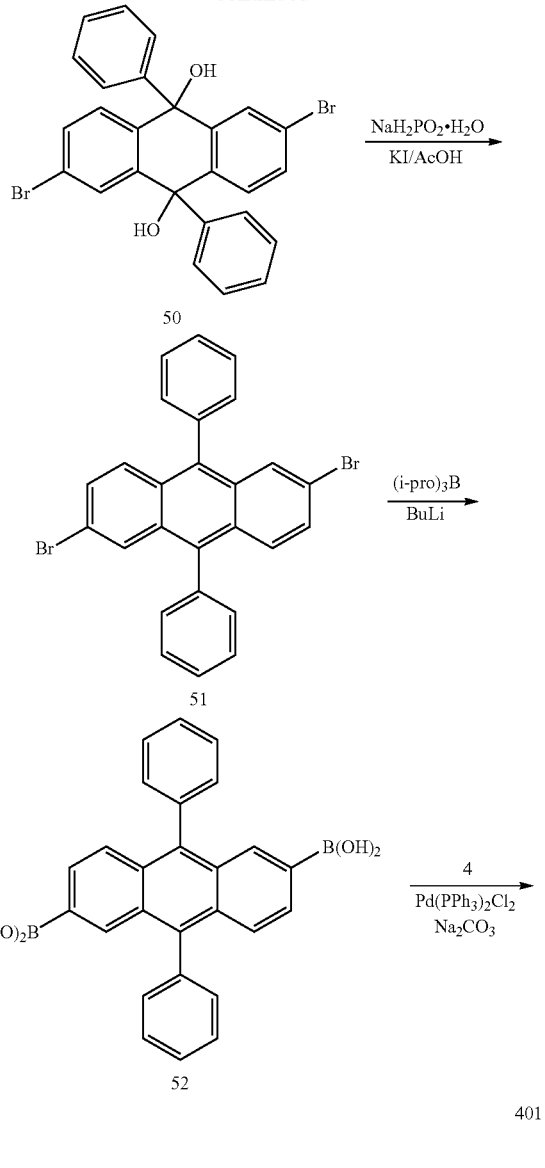

To 2,6-diaminoanthraquinone (100 g, 0.42 mol) were added copper bromide (328 g, 1.47 mol) and acetonitrile (1.5 L), followed by stirring. Then, t-butylnitrite (173 g, 1.68 mol) was slowly added thereto. One hour later, reflux with stirring was performed. 30 hours later, reaction temperature was lowered to room temperature. To the reaction solution was added 2 L of 10% HCl solution, which was stirred for 1 hour and filtered under the reduced pressure. The product was recrystallized by using hexane and methanol to give brown solid compound 49 (117 g, 76%).

$^1$H NMR (200 MHz, CDCl$_3$): δ (ppm)=7.68 (d, 2H), 7.73 (d, 2H), 7.96 (s, 2H)

MS/FAB: 365.84 (found), 366.00 (calculated)

To bromobenzene (51.47 g, 0.328 mol) was added tetrahydrofuran (910 mL), followed by stirring for 10 minutes at room temperature. Upon completion of dissolution, temperature was lowered to −72° C. to which n-butyllithium (1.6 M in n-hexane) (221 mL, 0.36 mol) was slowly added. One hour later, compound 49 (50 g, 0.14 mol) was added to the mixture and temperature was slowly raised to room temperature, followed by stirring for 22 hours. To the reaction solution was added 1 L of 10% HCl solution, which was stirred for 2 hours and filtered under the reduced pressure. The organic layer was separated and evaporated to give pink solid compound 50 (23.54 g, 33%).

$^1$H NMR (200 MHz, CDCl$_3$): δ (ppm)=7.18-7.20 (m, 12H), 7.35 (d, 2H), 7.47 (s, 2H)

MS/FAB: 521.95 (found), 522.22 (calculated)

To compound 50 (20 g, 38 mmol) were added potassium iodide (25.43 g, 0.15 mol), sodium phosphatemonohydrate (24.36 g, 0.23 mol) and acetic acid (128 mL), followed by reflux with stirring. 18 hours later, the mixture was cooled down at room temperature and filtered under the reduced pressure. To the solid product were added small amount of potassium carbonate and distilled water for neutralization. After 2 hours of stirring, the organic layer was separated and evaporated to give dark brown solid. The solid product proceeded onto silica gel column chromatography (dichloromethane:n-hexane=1:10) to give apricot colored solid compound 51 (7.85 g, 42%).

$^1$H NMR (200 MHz, CDCl$_3$) δ (ppm)=7.18-7.21 (m, 12H), 7.36 (d, 2H), 7.48 (s, 2H)

MS/FAB: 487.99 (found), 488.21 (calculated)

To compound 51 (7.85 g, 16.08 mmol) was added tetrahydrofuran (160 mL), followed by stirring for 10 minutes at room temperature. Upon completion of dissolution, temperature was lowered to −72° C. to which n-butyllithium (1.6 M in n-hexane) (16 mL, 20.9 mmol) was slowly added. One hour later, triisopropylborate (6.05 g, 32.16 mmol) was added to the mixture and temperature was slowly raised to room temperature, followed by stirring for 20 hours. To the reaction solution was added 100 mL of 10% HCl solution, which was stirred for 5 hours and filtered under the reduced pressure. The organic layer was obtained using 360 mL of dichloromethane, evaporated under the reduced pressure and recrystallized by using n-hexane and diethyl ether to give apricot colored solid compound 52 (5.24 g, 78%).

$^1$H NMR (200 MHz, CDCl$_3$): δ (ppm)=7.16-7.19 (m, 12H), 7.35 (d, 2H), 7.45 (s, 2H)

MS/FAB: 419.18 (found), 418.05 (calculated)

Compound 52 (7.0 g, 14.34 mmol), compound 4 (9.4 g, 34.4 mmol), trans-dichlorobis(triphenylphosphine)palladium (II) (1.0 g, 1.43 mmol), sodium carbonate (6.08 g, 57.36 mmol), toluene (150 mL) and distilled water (15 mL) were all mixed, followed by reflux with stirring. 40 hours later, reaction temperature was lowered to room temperature and 100 mL of distilled water was added thereto to terminate the reaction. The organic layer was obtained using 360 mL of ethyl acetate and evaporated under the reduced pressure. The product proceeded onto silica gel column chromatography (dichloromethane:n-hexane=1:2), and was recrystallized by using n-hexane and methanol to give yellow solid compound 401 (2.46 g, 24%).

$^1$H NMR (200 MHz, CDCl$_3$): δ (ppm)=1.66 (s, 12H), 7.23 (t, 2H), 7.29-7.33 (m, 8H), 7.49-7.59 (m, 10H), 7.74-7.78 (d, 4H), 7.85-7.89 (d, 6H)

MS/FAB: 714.13 (found), 714.93 (calculated)

| No. | $^1$H NMR (200 MHz, CDCl$_3$): δ (ppm) |
|---|---|
| 401 | 1.66 (s, 12H), 7.23 (t, 2H), 7.29-7.33 (m, 8H), 7.49-7.59 (m, 10H), 7.74-7.78 (d, 4H), 7.85-7.89 (d, 6H) |
| 402 | 1.66 (s, 12H), 7.22-7.26 (m, 6H), 7.27-7.33 (m, 12H), 7.53-7.59 (m, 12H), 7.73-7.77 (d, 4H), 7.87-7.91 (d, 8H) |
| 403 | 1.66 (s, 12H), 7.20-7.26 (m, 8H), 7.26-7.35 (m, 18H), 7.46-7.58 (m, 14H), 7.75-7.78 (d, 4H), 7.87-7.91 (d, 6H) |
| 404 | 7.05-7.15 (m, 6H), 7.29-7.32 (m, 10H), 7.39 (t, 4H), 7.56-7.61 (m, 16H), 7.64-7.76 (m, 14H), 7.88-7.90 (d, 4H) |
| 405 | 1.67 (s, 12H), 7.17-7.28 (m, 12H), 7.34-7.38 (m, 8H), 7.57-7.61 (m, 10H), 7.75-7.77 (m, 10H), 7.84-7.89 (m, 10H) |

Example 1

Preparation of OLED Device Using the Compound of the Present Invention

The present inventors prepared a novel OLED device using the luminescent material of the present invention.

First, ultrasonic cleaning of transparent electrode ITO thin layer (15Ω/□ obtained from the glass for OLED was performed serially using trichloroethylene, acetone, ethanol and then distilled water. Then the ITO thin layer was stored in isopropanol until use.

Second, ITO substrate was installed on the substrate folder of vacuum plating apparatus, and then 4,4',4"-tris(N,N-(2-naphthyl)-phenylamino) triphenylamine (2-TNATA) with the following structure was established in the cell of the vacuum plating apparatus. Ventilation was performed until the degree of vacuum of the chamber reached 10$^{-6}$ torr, and then electric current was applied to evaporate 2-TNATA. As a result, a 60 nm thick hole injection layer was plated on ITO substrate.

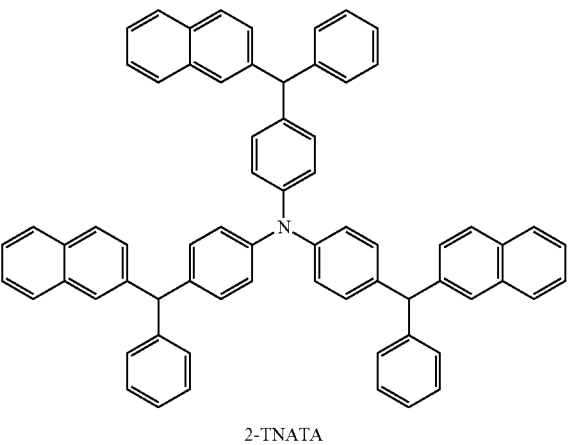

2-TNATA

Next, N,N'-bis(α-naphthyl)-N,N'-diphenyl-4,4'-diamine (NPB) with the following structure was established in another cell of the vacuum plating apparatus, to which electric current was applied to evaporate NPB. As a result, a 20 nm thick hole transport layer was plated on the hole injection layer.

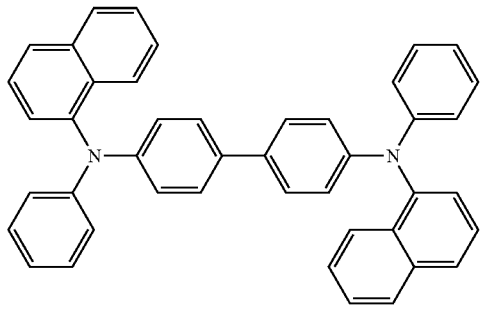

NPB

After generating the hole injection layer and the hole transport layer, a luminescent layer was plated thereon. A compound of the present invention (ex: compound 301) was loaded in one cell of the vacuum plating apparatus and the dopant luminous material having the following structure was loaded in another cell of the apparatus. Plating speed was set at 100:1 to form a 35 nm thick luminescent layer on the above hole transport layer.

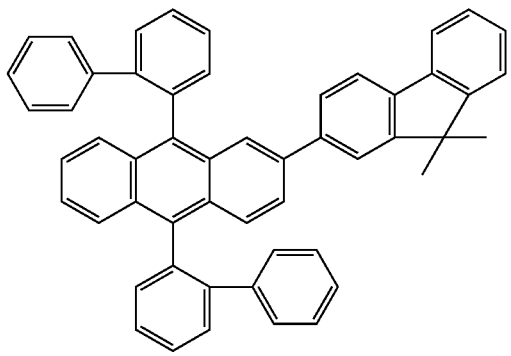

301

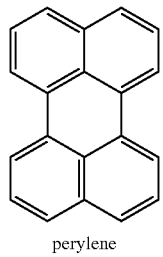

perylene

Then, tris(8-hydroxyquinoline)-aluminum(III)(Alq) in 20 nm thickness having the following structure was plated as an electron transport layer and then lithium quinolate (Liq) in 12 nm thickness was plated as an electron injection layer. AL cathode in 150 nm thickness was also plated using another vacuum plating apparatus to produce OLED.

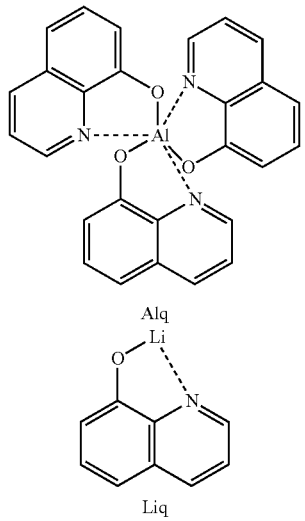

Alq

Liq

Each material used for the preparation of OLED device was purified by vacuum sublimation under $10^{-6}$ torr and then used as luminous materials for OLED.

Comparative Example 1

Preparation of OLED Device Using the Conventional Luminous Materials

A hole injection layer and a hole transport layer were formed by the same manner as described in Example 1. Then, blue luminous material dinaphthylanthracene(DNA) was loaded in one cell of the vacuum plating apparatus and another blue luminous material perylene having the following structure was loaded in the other cell. Plating speed was set at 100:1 to form a 35 nm thick luminescent layer on the said hole transport layer.

An electron transport layer and an electron injection layer were formed by the same manner as described in Example 1, and Al cathode in 150 nm thickness was plated by using another vacuum plating apparatus to produce OLED.

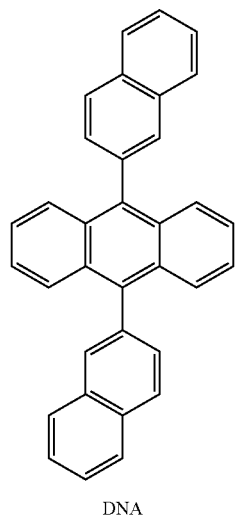

DNA

Example 2

Luminescent Characteristics of OLED Device of the Invention

Luminescent efficiency of each device respectively containing the organic electroluminescent compound of the present invention prepared in Example 1 and the conventional light-emitting compound prepared in Comparative Example 1 was measured at 500 cd/m² and 2,000 cd/m² and the results are shown in Table 1. Considering the importance of luminescent characteristics of particularly the blue luminous material in low-brightness area and panel, the brightness data at 2,000 cd/m² was determined as standard.

TABLE 1

| No. | Luminous material 1 | Luminous material 2 | EL peak (nm) | Luminescent efficiency (cd/A) @500 cd/m² | Luminescent efficiency (cd/A) @2,000 cd/m² | Color coordinate X | Color coordinate Y | Luminescent efficiency/Y |
|---|---|---|---|---|---|---|---|---|
| 1 | 101 | perylene | 452,480 | 4.77 | 4.12 | 0.157 | 0.188 | 25.4 |
| 2 | 102 | perylene | 452,480 | 4.85 | 4.23 | 0.157 | 0.189 | 25.7 |
| 3 | 103 | perylene | 452,480 | 4.79 | 4.21 | 0.158 | 0.188 | 25.5 |
| 4 | 104 | perylene | 452,480 | 4.60 | 4.18 | 0.158 | 0.189 | 24.3 |
| 5 | 105 | perylene | 450,478 | 4.57 | 4.05 | 0.157 | 0.185 | 24.7 |
| 6 | 106 | perylene | 450,478 | 4.57 | 4.19 | 0.158 | 0.186 | 24.6 |
| 7 | 107 | perylene | 452,480 | 4.81 | 4.33 | 0.158 | 0.190 | 25.3 |
| 8 | 108 | perylene | 452,480 | 4.97 | 4.38 | 0.159 | 0.189 | 26.3 |
| 9 | 109 | perylene | 452,480 | 4.90 | 4.31 | 0.157 | 0.187 | 26.2 |
| 10 | 110 | perylene | 452,480 | 4.96 | 4.36 | 0.157 | 0.189 | 26.2 |
| 11 | 111 | perylene | 460,488 | 5.80 | 5.14 | 0.161 | 0.207 | 28.0 |
| 12 | 112 | perylene | 460,488 | 5.92 | 5.22 | 0.161 | 0.210 | 28.2 |
| 13 | 113 | perylene | 460,488 | 5.85 | 5.19 | 0.161 | 0.208 | 28.1 |
| 14 | 201 | perylene | 452,482 | 5.13 | 4.55 | 0.158 | 0.190 | 27.0 |
| 15 | 202 | perylene | 452,482 | 5.24 | 4.58 | 0.158 | 0.191 | 27.4 |
| 16 | 203 | perylene | 452,482 | 5.26 | 4.62 | 0.158 | 0.192 | 27.4 |
| 17 | 204 | perylene | 452,482 | 5.18 | 4.62 | 0.159 | 0.193 | 26.8 |
| 18 | 205 | perylene | 454,484 | 5.38 | 4.79 | 0.160 | 0.194 | 27.7 |
| 19 | 206 | perylene | 454,484 | 5.40 | 4.80 | 0.160 | 0.196 | 27.6 |
| 20 | 207 | perylene | 454,484 | 5.42 | 4.85 | 0.160 | 0.195 | 27.8 |
| 21 | 208 | perylene | 456,484 | 5.90 | 5.17 | 0.161 | 0.201 | 29.4 |
| 22 | 209 | perylene | 456,484 | 5.98 | 5.27 | 0.162 | 0.202 | 29.6 |
| 23 | 210 | perylene | 460,488 | 5.90 | 5.30 | 0.161 | 0.210 | 28.1 |
| 24 | 301 | perylene | 452,482 | 5.41 | 4.70 | 0.157 | 0.191 | 28.3 |
| 25 | 302 | perylene | 452,480 | 5.20 | 4.43 | 0.155 | 0.189 | 27.5 |
| 26 | 303 | perylene | 452,480 | 5.21 | 4.37 | 0.156 | 0.189 | 27.6 |
| 27 | 304 | perylene | 456,484 | 4.77 | 4.20 | 0.160 | 0.203 | 23.5 |
| 28 | 305 | perylene | 452,482 | 4.50 | 4.12 | 0.158 | 0.190 | 23.7 |
| 29 | 306 | perylene | 456,484 | 5.78 | 5.27 | 0.161 | 0.205 | 28.2 |
| 30 | 307 | perylene | 458,486 | 5.86 | 5.40 | 0.163 | 0.209 | 28.0 |
| 31 | 308 | perylene | 456,484 | 5.91 | 5.22 | 0.164 | 0.206 | 28.7 |
| 32 | 309 | perylene | 462,490 | 6.12 | 5.76 | 0.167 | 0.213 | 28.7 |
| 33 | 401 | perylene | 450,478 | 5.23 | 4.76 | 0.153 | 0.182 | 28.7 |
| 34 | 402 | perylene | 450,478 | 5.68 | 4.91 | 0.154 | 0.182 | 31.2 |
| 35 | 403 | perylene | 450,478 | 5.59 | 4.85 | 0.157 | 0.186 | 30.1 |
| 36 | 404 | perylene | 452,482 | 5.74 | 5.04 | 0.156 | 0.191 | 30.1 |
| 37 | 405 | perylene | 456,484 | 5.90 | 5.34 | 0.160 | 0.197 | 29.9 |
| Comparative Example 1 | DNA | perylene | 456,484 | 4.45 | 3.62 | 0.160 | 0.200 | 22.3 |

As shown in Table 1, the OLED device of Comparative Example 1 containing DNA:perylene, known as the conventional luminous material was compared with the OLED device using the organic electroluminescent compound of the present invention in luminescent efficiency/Y value, which was nearly consistent with quantum efficiency. As a result, the OLED device using the organic electroluminescent compound of the present invention exhibited higher luminescent efficiency/Y value.

Therefore, the organic electroluminescent compound of the present invention can be used as a blue luminous material with high efficiency and comparatively greater advantages in brightness and power consumption than the conventional full colored OLED.

INDUSTRIAL APPLICABILITY

The organic electroluminescent compound of the present invention has high luminescent efficiency and long lifetime, so that it can be useful for the production of OLED device with excellent working lifetime. The organic electroluminescent compound of the present invention also is characterized by upgraded excellent EL property when it is used as other layers as well as luminescent layer.

Those skilled in the art will appreciate that the conceptions and specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

The invention claimed is:

1. An organic electroluminescent compound represented by the following formula 1

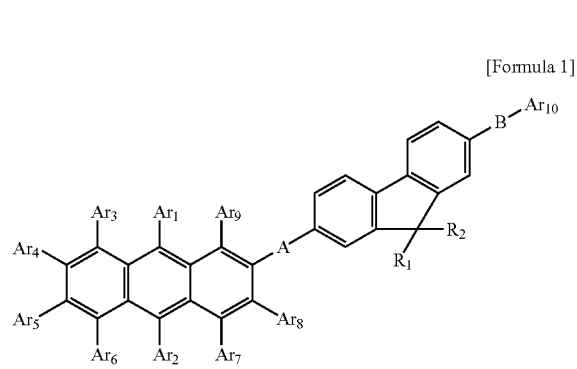

[Formula 1]

Wherein, A and B are independently chemical bonds or $C_6$-$C_{30}$ arylene;

$Ar_1$ and $Ar_2$ are independently $C_6$-$C_{30}$ aryls;

$Ar_3$-$Ar_9$ are independently H, $C_1$-$C_{20}$ straight or branched alkyl or alkoxy, $C_6$-$C_{30}$ aryl or heteroaryl, or halogen;

$R_1$ and $R_2$ are independently H, $C_1$-$C_{20}$ straight or branched alkyl, or $C_6$-$C_{30}$ aryl, and $R_1$ and $R_2$ can form a spiro ring by alkylene or fusion ring alkylene;

$Ar_{10}$ is H, $C_1$-$C_{20}$ straight or branched alkyl, $C_6$-$C_{30}$ aryl or halogen; and The said arylene, aryl, heteroaryl, alkyl, and alkoxy can be substituted with $C_1$-$C_{20}$ straight or branched alkyl, diarylamino or halogen.

2. The organic electroluminescent compound according to claim 1, wherein the $Ar_{10}$ is phenyl, naphthyl, anthryl or fluorenyl with or without substitution of one or more compounds selected from the group consisting of $C_1$-$C_{20}$ straight or branched alkyl, phenyl, naphthyl, fluorenyl, diarylamino and halogen.

3. The organic electroluminescent compound according to claim 1, which is represented by the following formula 2

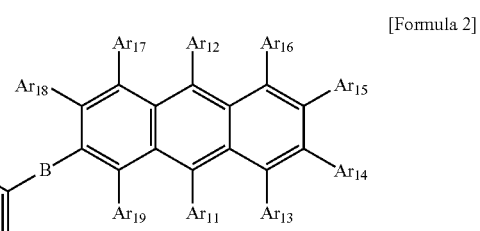
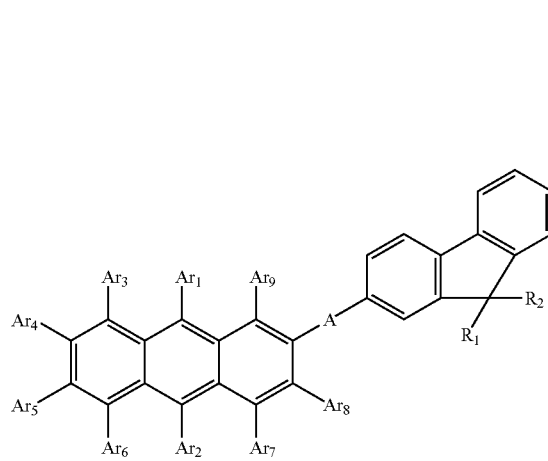

[Formula 2]

Wherein, $Ar_1$-$Ar_9$ are the same as defined in formula 1;

$Ar_{11}$ and $Ar_{12}$ are independently $C_6$-$C_{30}$ aryl;

$Ar_{13}$-$Ar_{19}$ are independently H, $C_1$-$C_{20}$ straight or branched alkyl or alkoxy, $C_6$-$C_{30}$ aryl or heteroaryl, or halogen; and The aryl, heteroaryl and alkyl can be substituted with $C_1$-$C_{20}$ straight or branched alkyl, aryl, diarylamino or halogen.

4. The organic electroluminescent compound according to claim 1, wherein the $R_1$ and $R_2$ are independently selected from the group consisting of hydrogen, methyl, ethyl, propyl, isopropyl, butyl, isobutyl, pentyl, hexyl, ethylhexyl, heptyl, octyl, isooctyl, nonyl, decyl, dodecyl, hexadecyl, cyclopentyl, cyclohexyl, phenyl, tolyl, biphenyl, benzyl, naphthyl, anthryl and fluorenyl.

5. The organic electroluminescent compound according to claim 3, wherein the $Ar_1$, $Ar_2$, $Ar_{11}$ and $Ar_{12}$ are independently selected from the group consisting of phenyl, tolyl, biphenyl, benzyl, naphthyl, anthryl and fluorenyl.

6. The organic electroluminescent compound according to claim 1, which is represented by either the following formula 3 or formula 4

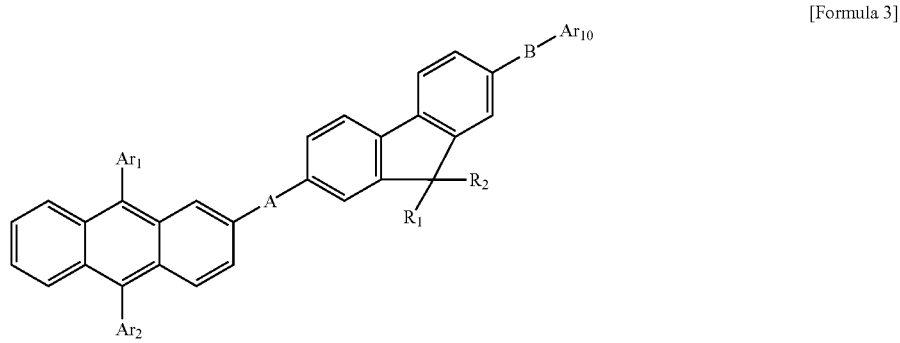

[Formula 3]

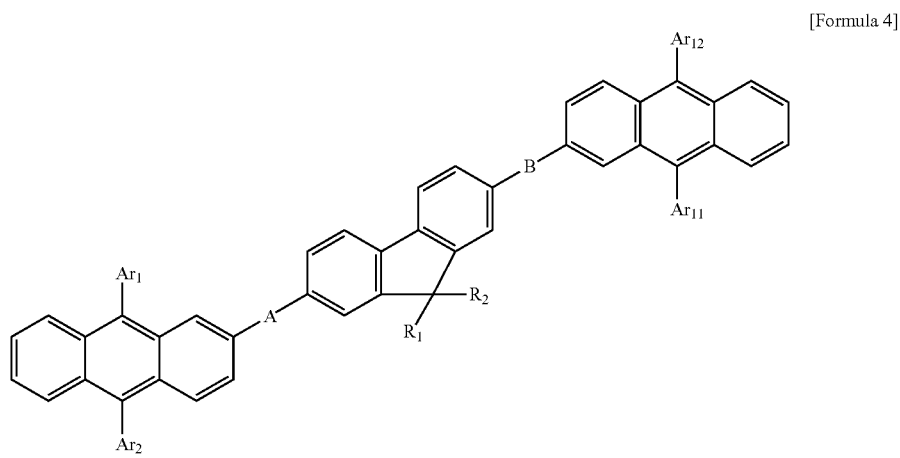

[Formula 4]

In formula 3 and formula 4, A and B are independently chemical bonds or 1,4-phenylene, 1,3-phenylene, 1,4-naphthalene, 1,5-naphthalene or 2,6-naphthalene; and $Ar_1, Ar_2, Ar_{11}$ and $Ar_{12}$ are independently selected from the group consisting of phenyl, 4-tolyl, 3-tolyl, 2-tolyl, 2-biphenyl, 3-biphenyl, 4-biphenyl, (3,5-diphenyl)phenyl, 9,9-dimethyl-fluorene-2-yl, 9,9-diphenyl-fluorene-2-yl, (9,9-(4-methylphenyl)-fluorene-2-yl, 1-naphthyl, 2-naphthyl, 1-anthryl, 2-anthryl, 3-anthryl and 2-spirofluorenyl.

7. The organic electroluminescent compound according to claim 6, which is selected among compounds represented by the following formulas

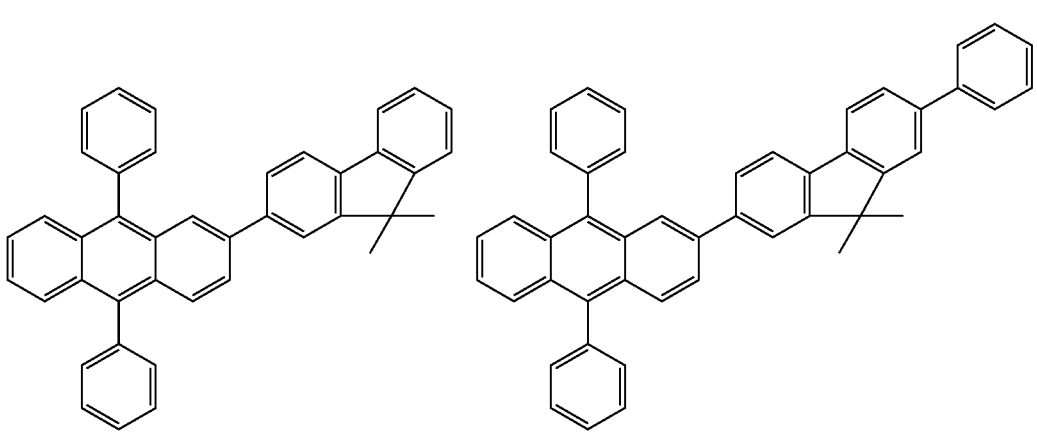

-continued
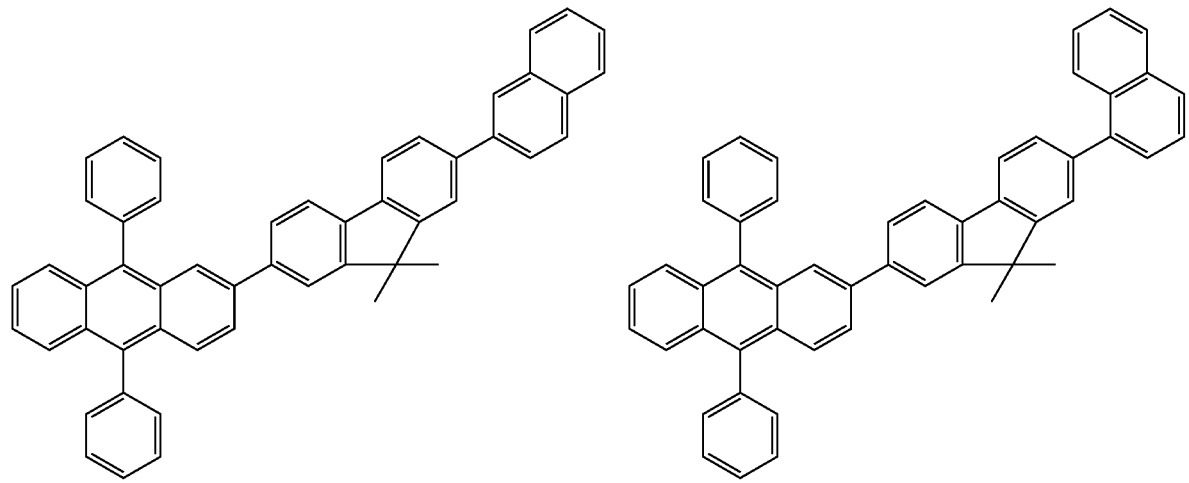
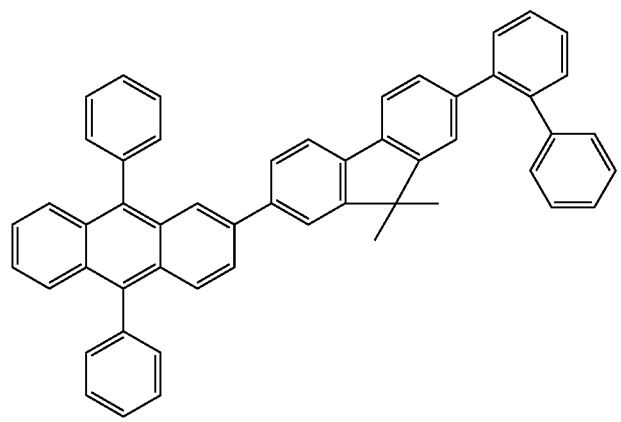
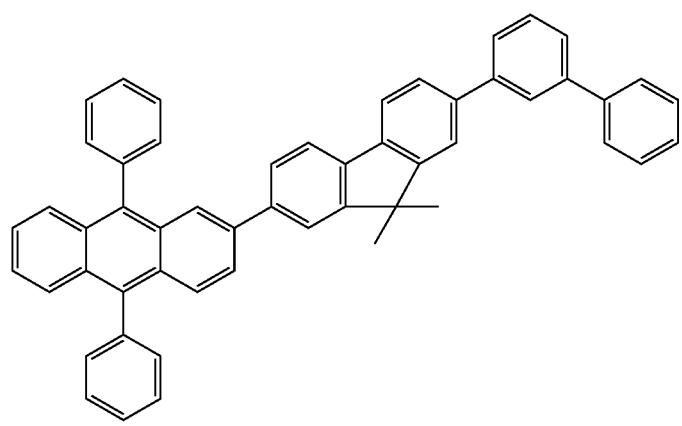

-continued
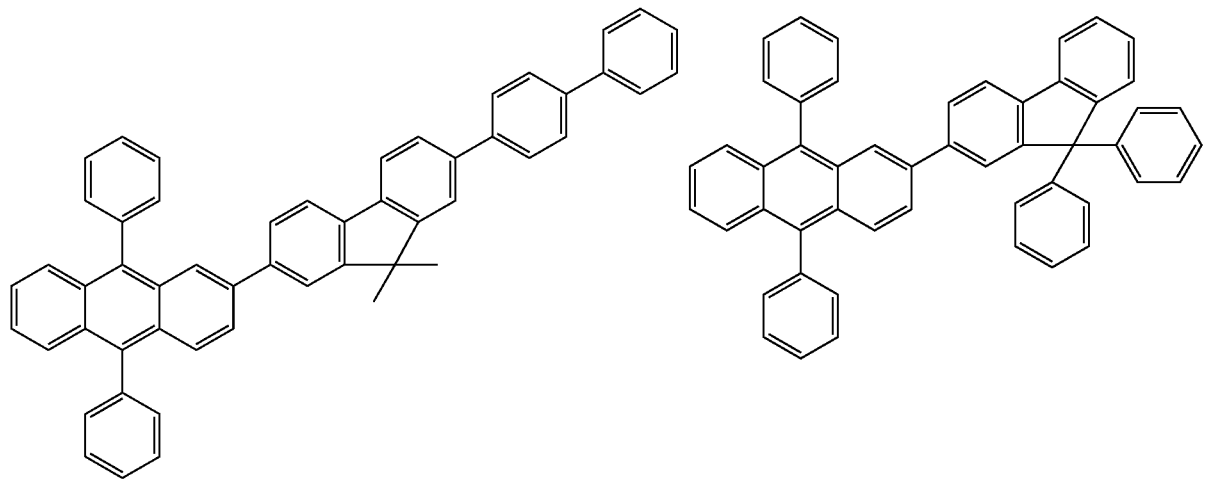
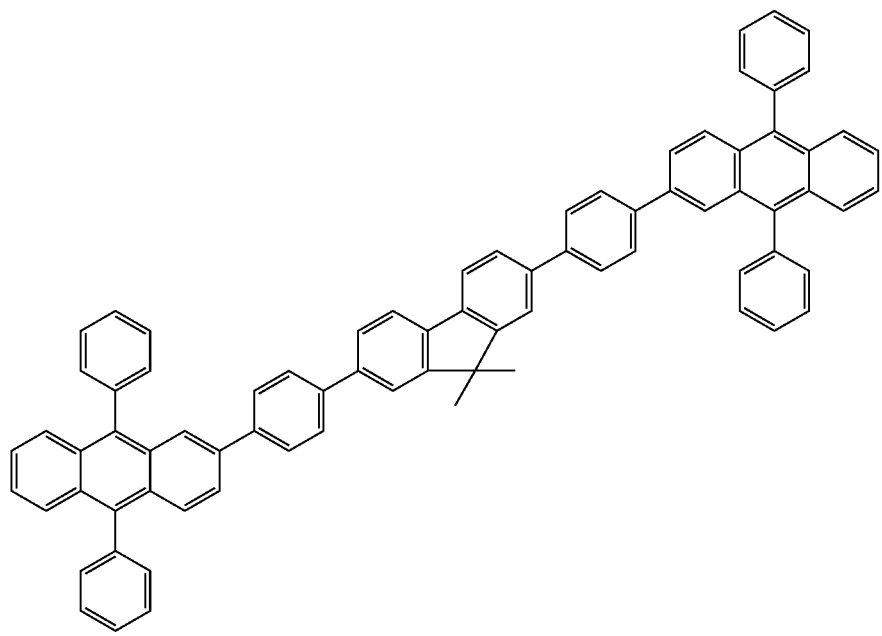
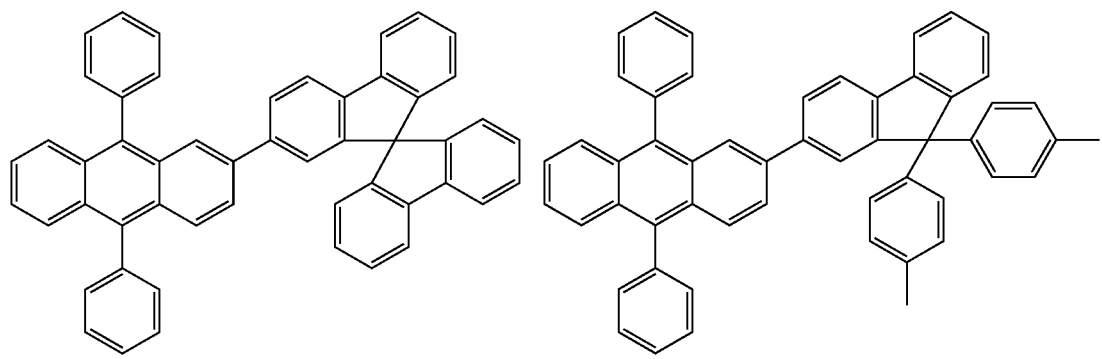

-continued
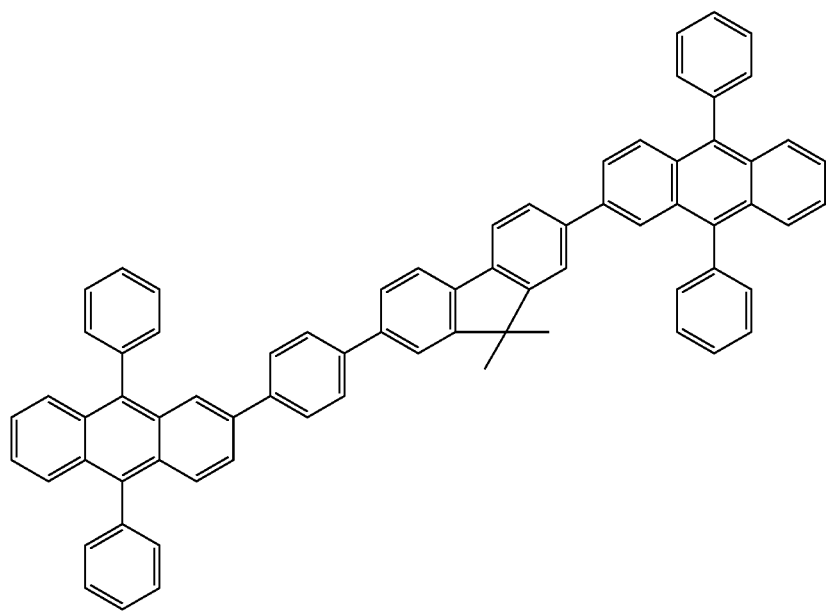
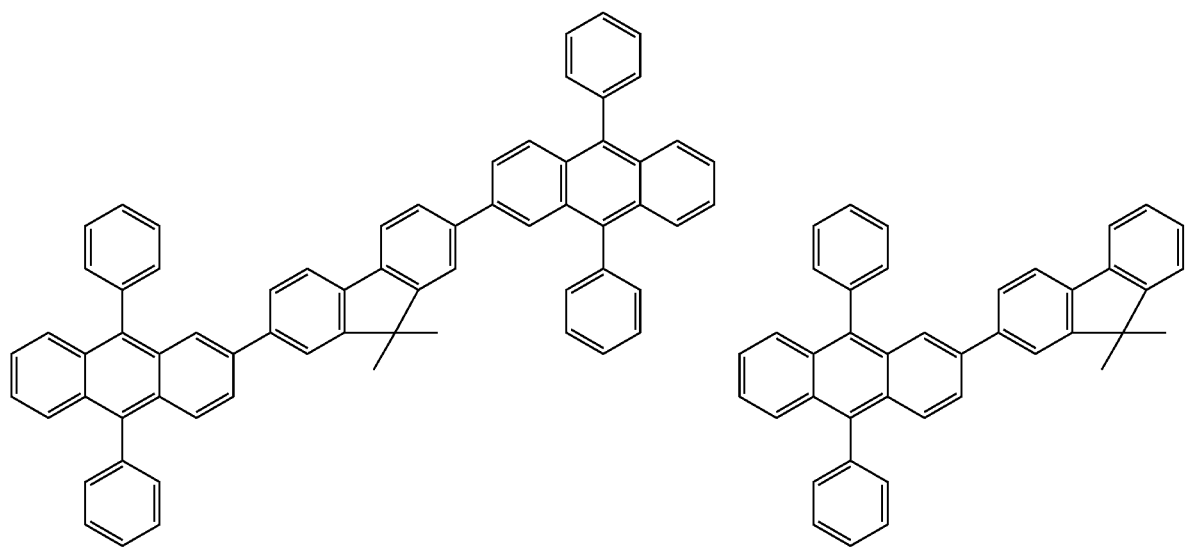
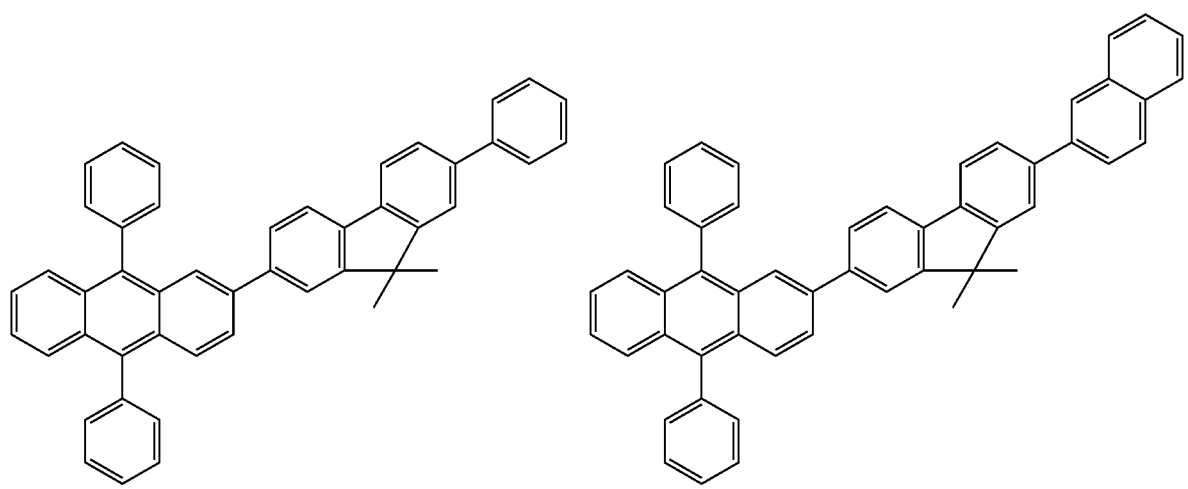

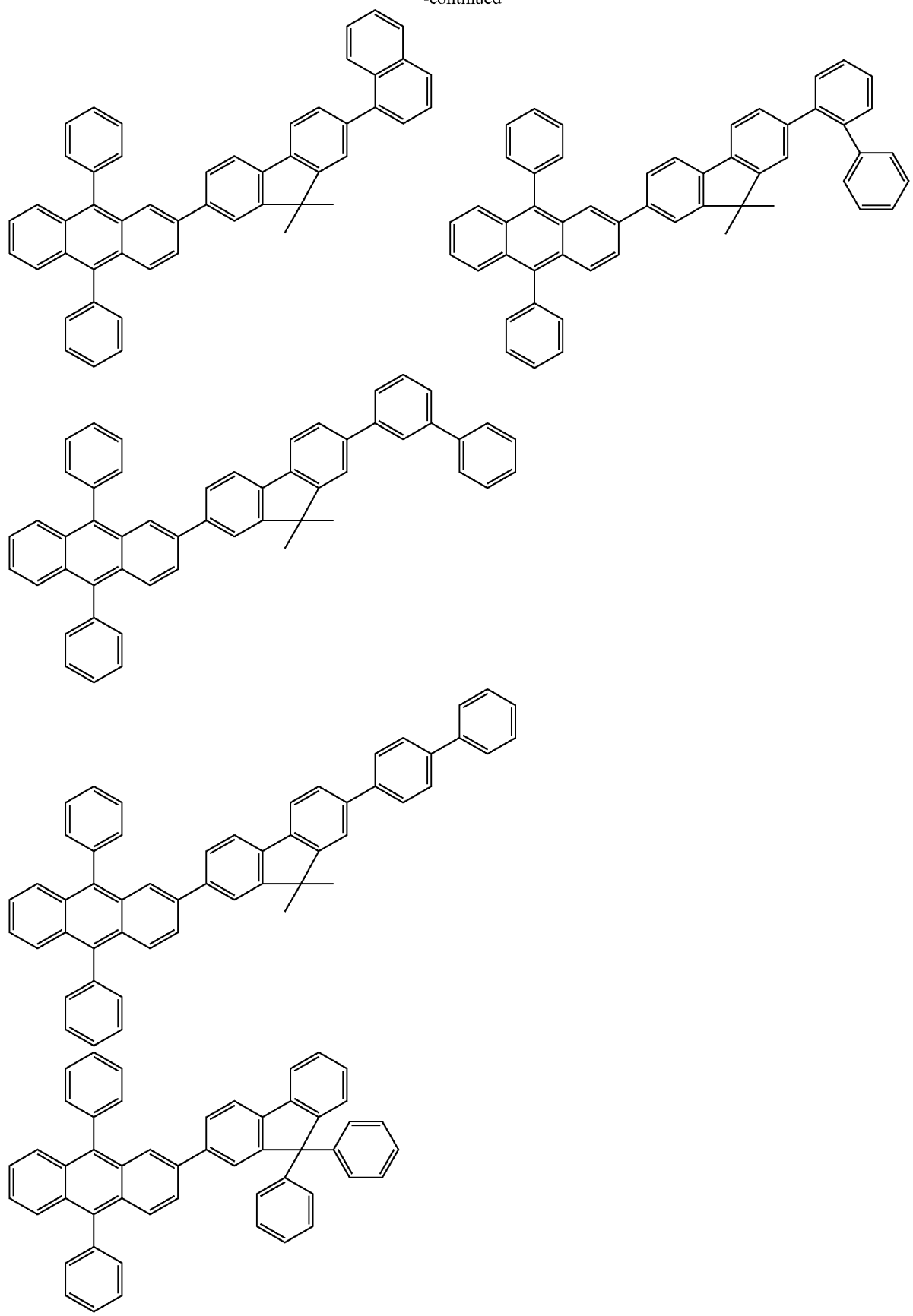

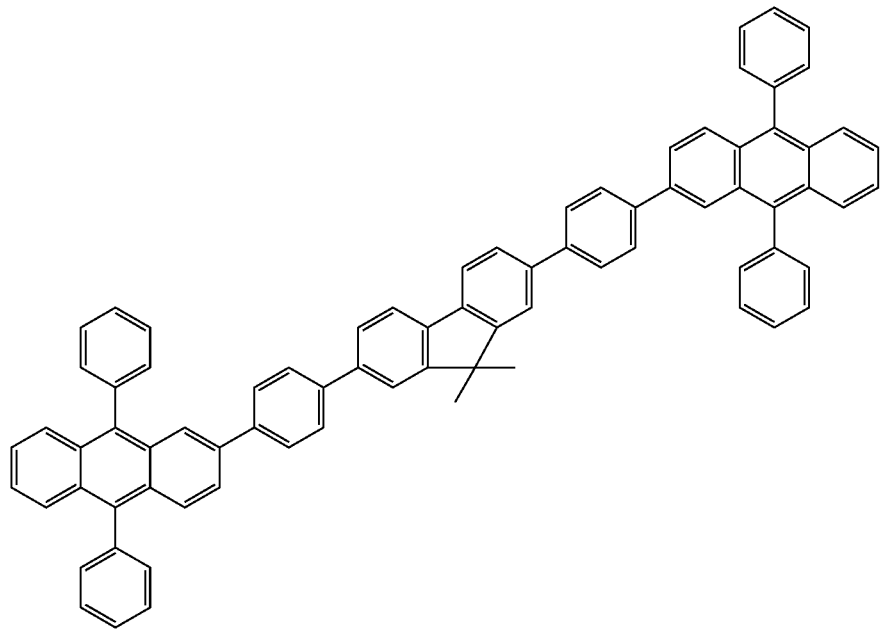
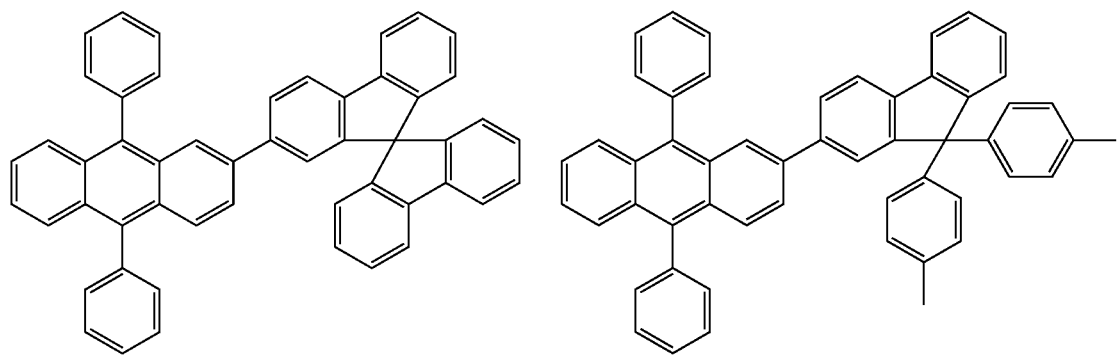
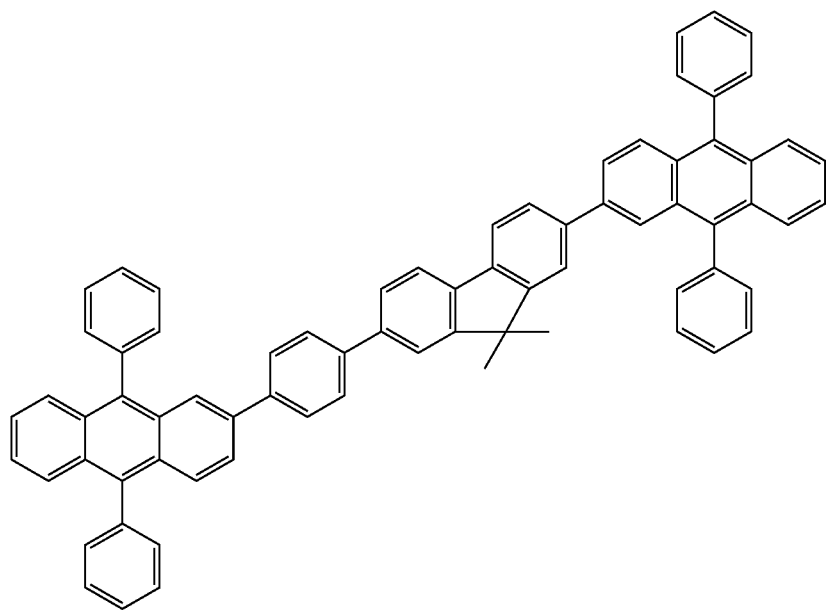

-continued
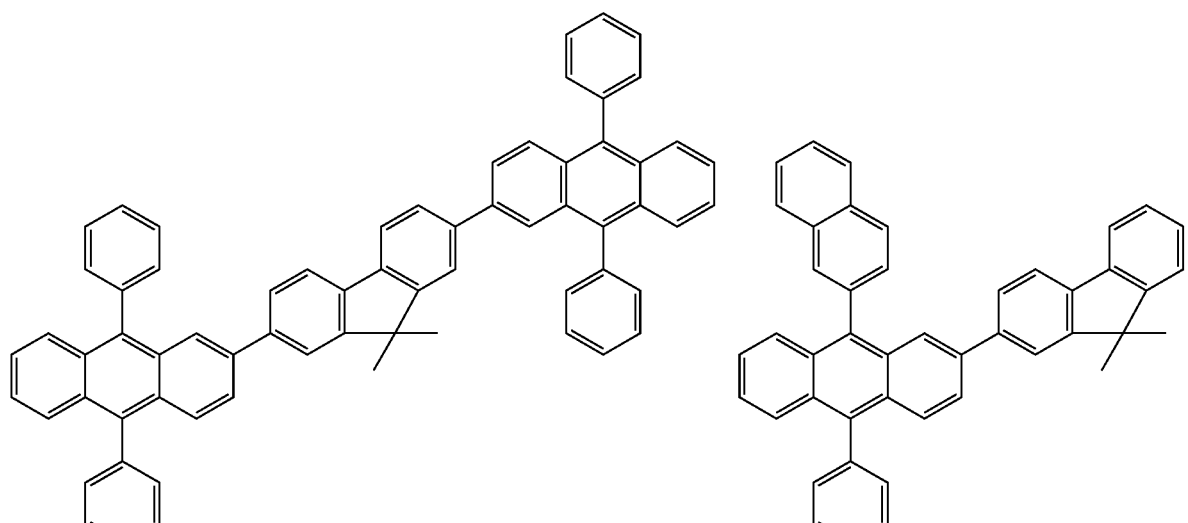
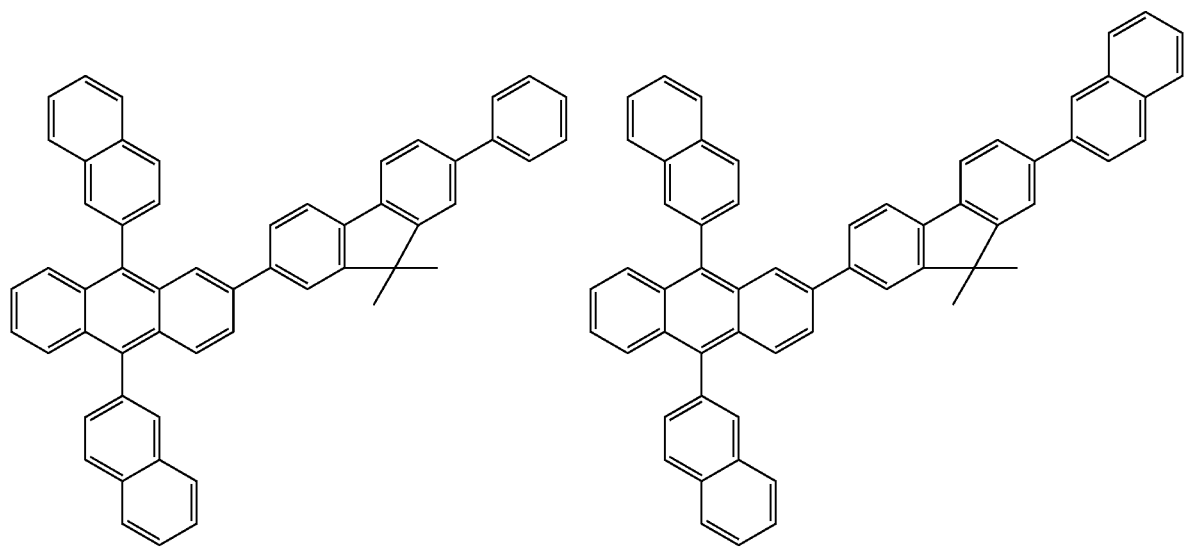
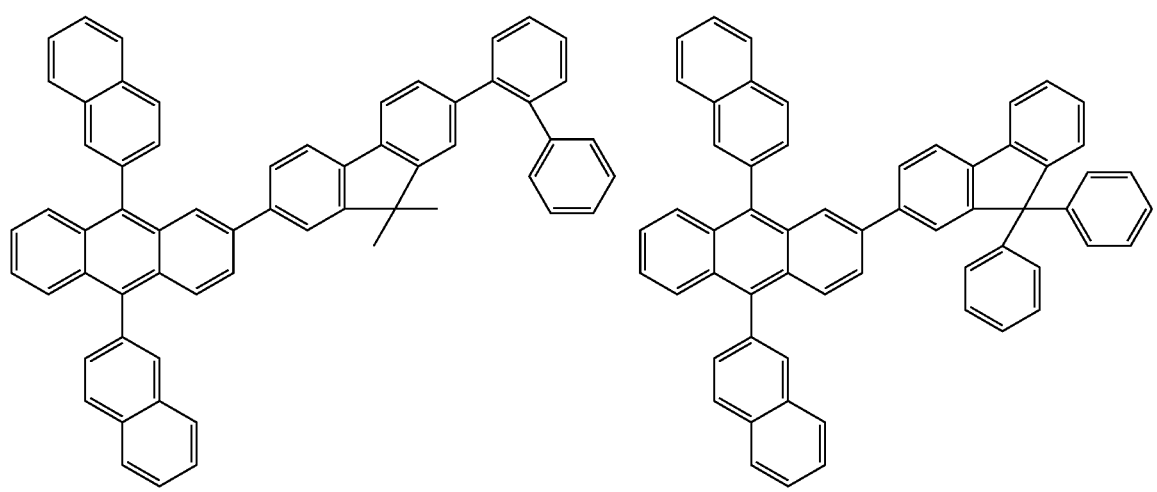

-continued
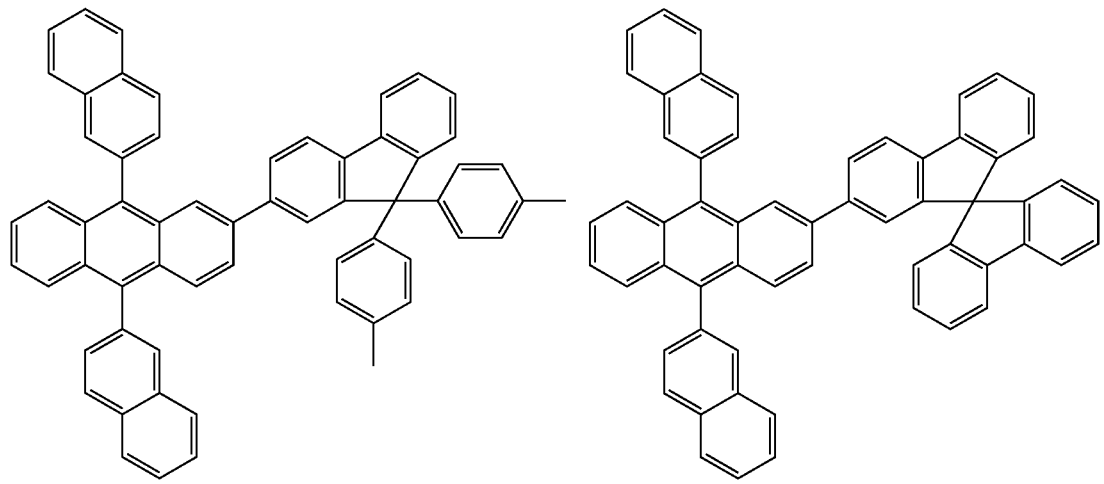
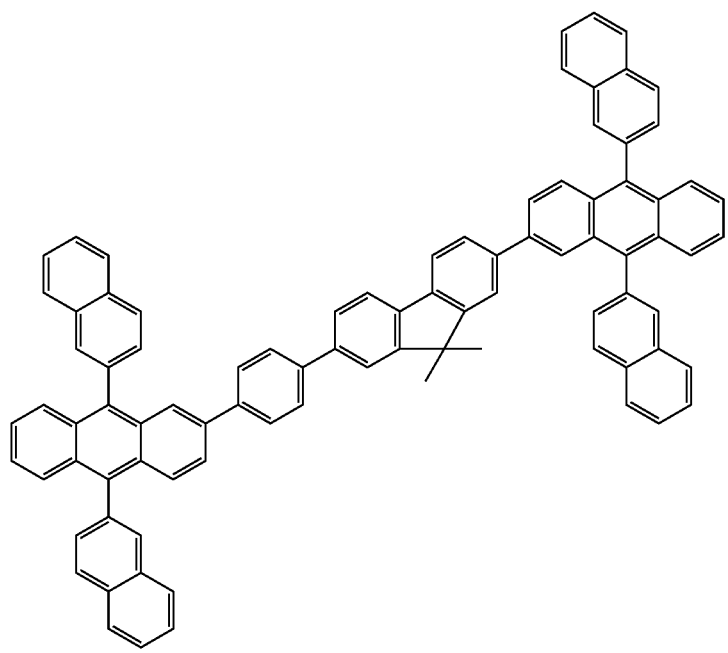
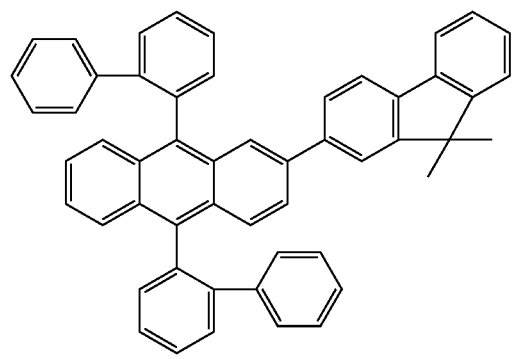

-continued
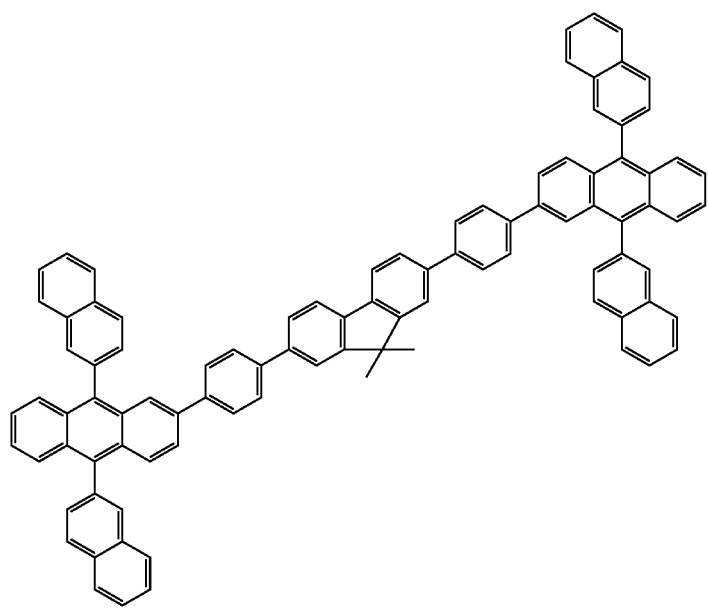
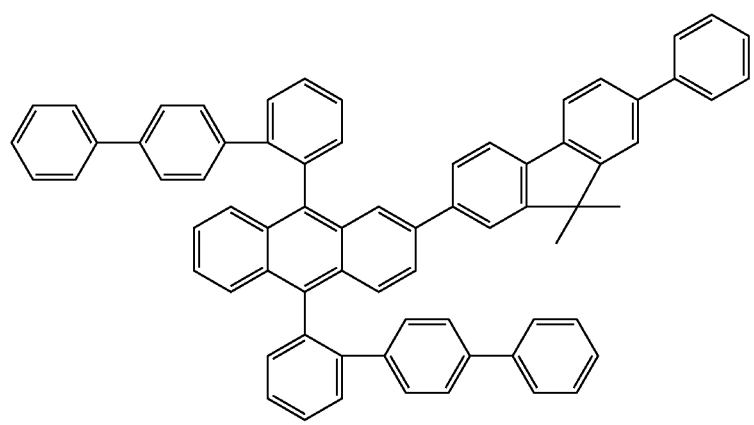
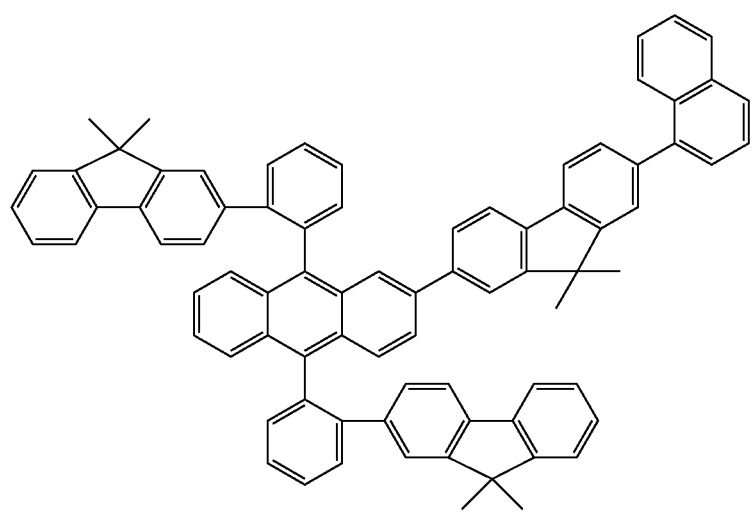

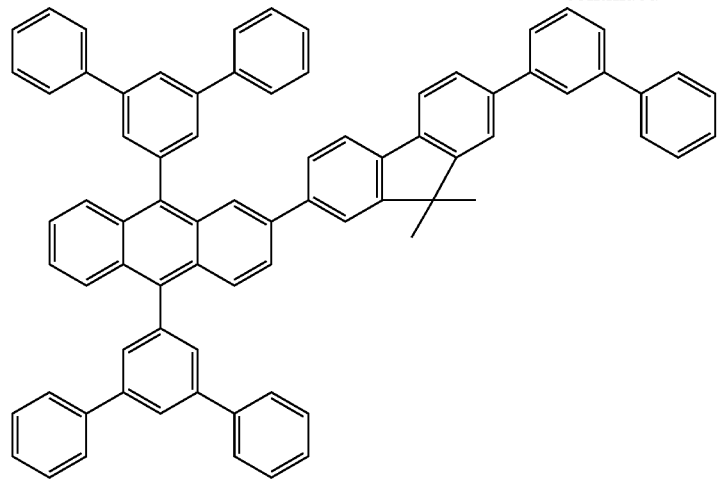
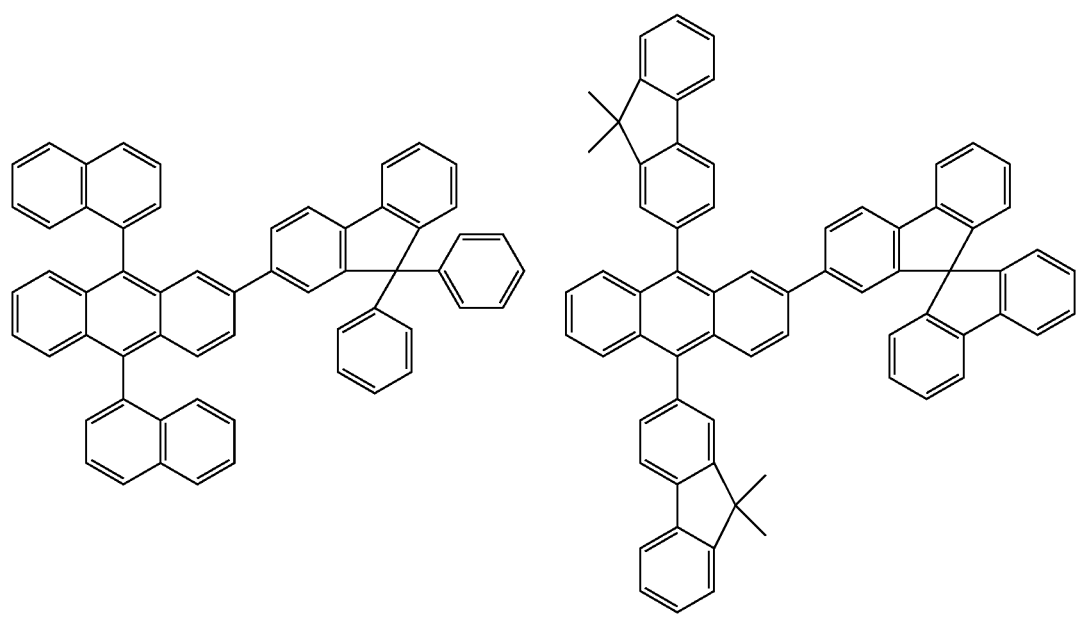
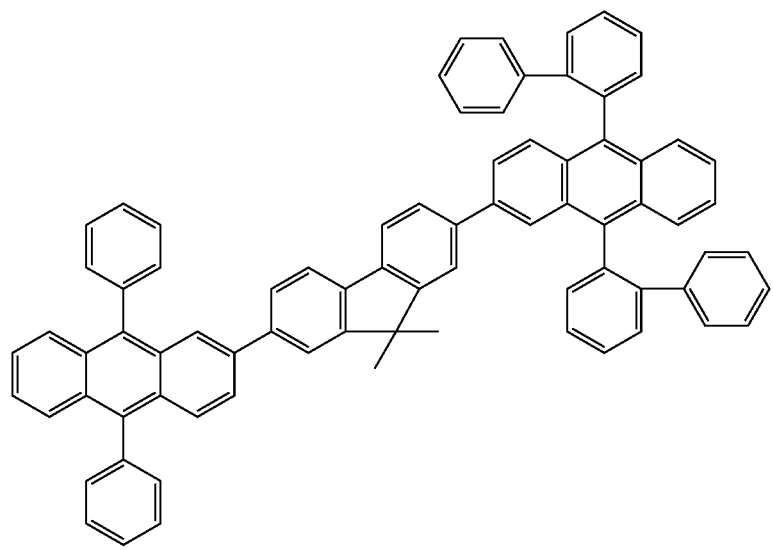

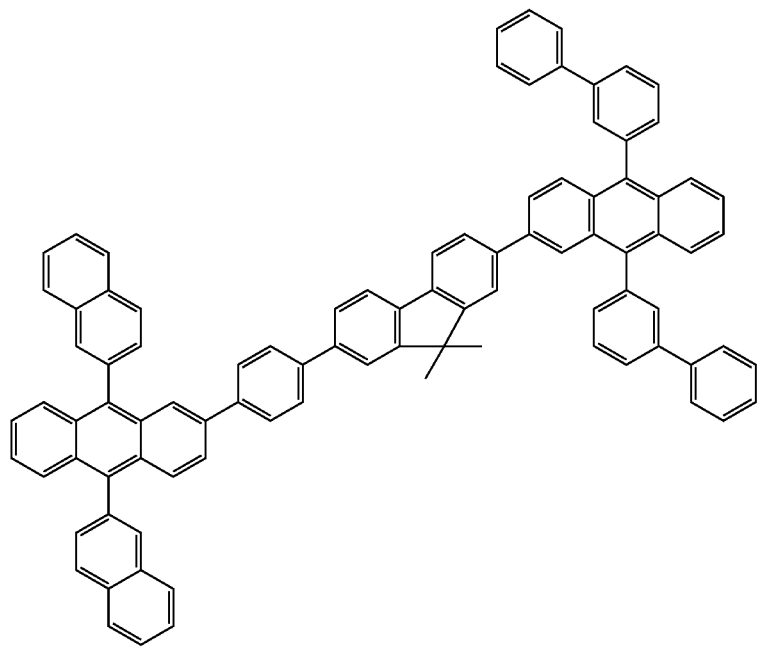
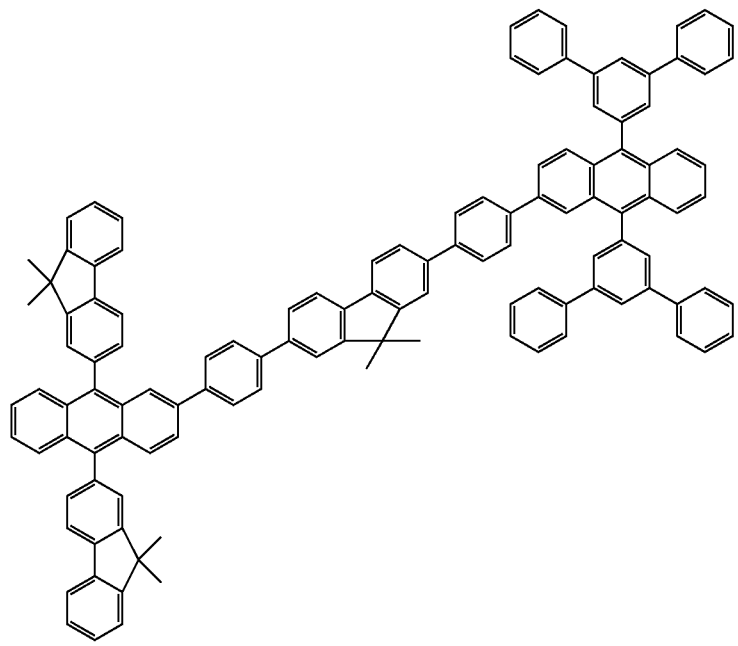
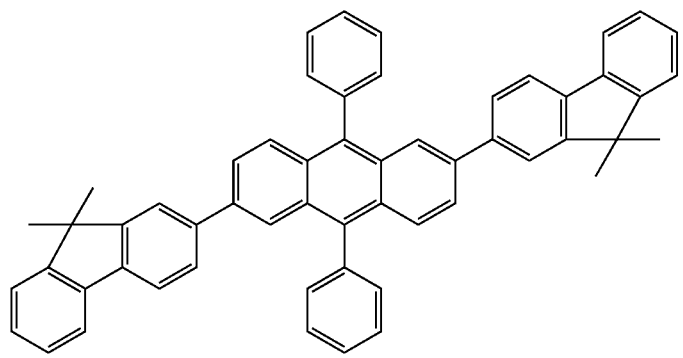

-continued
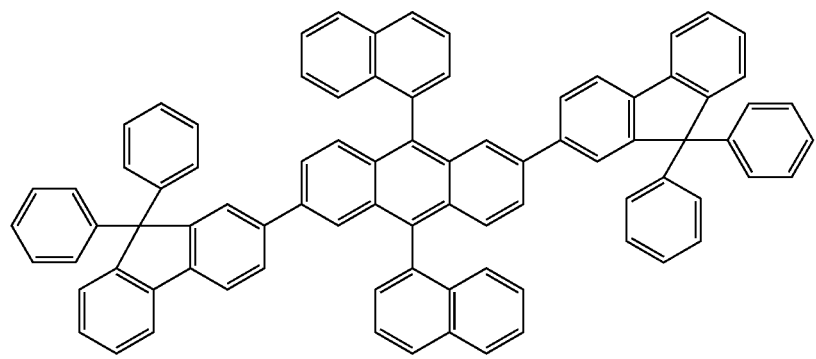
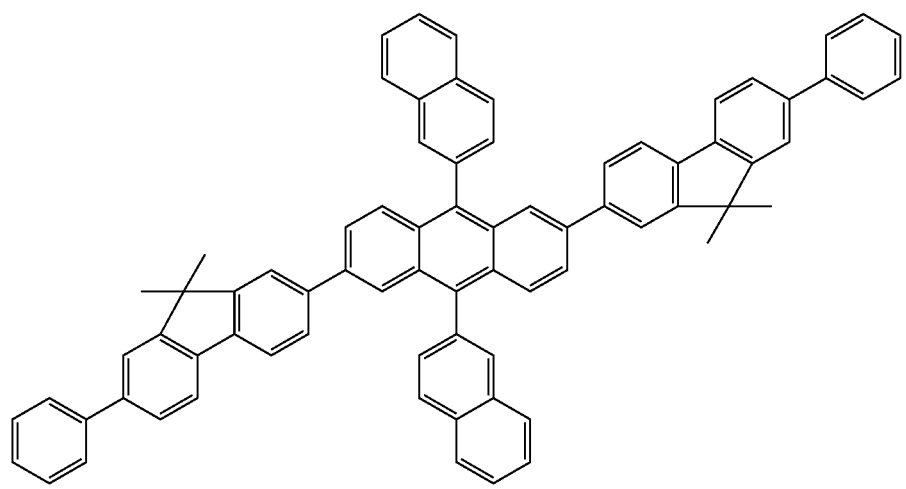
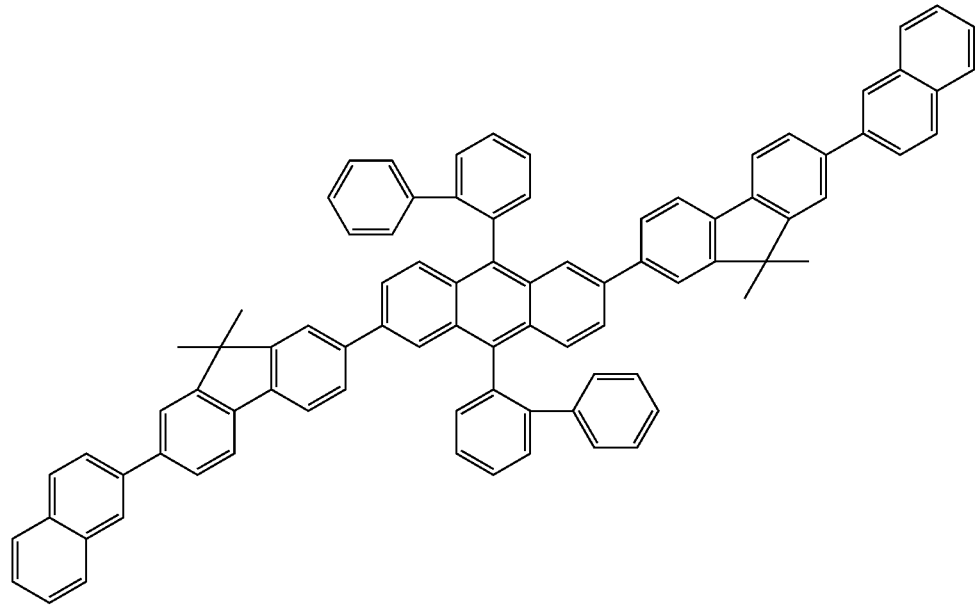

-continued
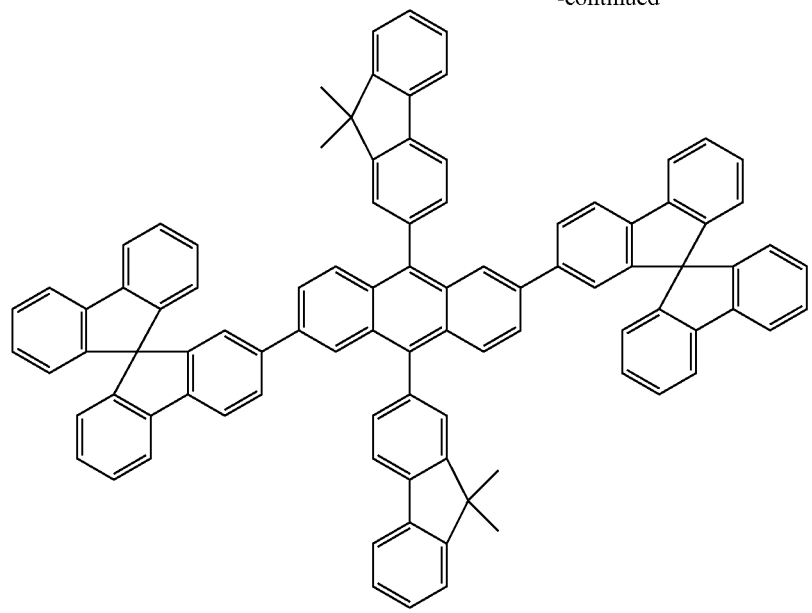
8. An organic light-emitting display device containing the organic electroluminescent compounds according to any one of claims 1 to 7.
9. An organic light-emitting display device containing the organic electroluminescent compounds between cathode and anode according to any one of claims 1 to 7.
* * * * *